United States Patent
Inage et al.

(10) Patent No.: US 7,027,271 B2
(45) Date of Patent: Apr. 11, 2006

(54) MAGNETORESISTIVE DEVICE IN A THIN-FILM MAGNETIC HEAD AND METHOD OF MANUFACTURING SAME HAVING PARTICULAR ELECTRODE OVERLAY CONFIGURATION

(75) Inventors: Kenji Inage, Tokyo (JP); Yoshihiro Kudo, Tokyo (JP); Ken-ichi Takano, Tokyo (JP); Koichi Terunuma, Tokyo (JP); Yuzuru Iwai, Tokyo (JP)

(73) Assignee: TDK Corporation, Tokyo (JP)

( * ) Notice: Subject to any disclaimer, the term of this patent is extended or adjusted under 35 U.S.C. 154(b) by 227 days.

(21) Appl. No.: 09/911,408

(22) Filed: Jul. 25, 2001

(65) Prior Publication Data

US 2002/0036497 A1    Mar. 28, 2002

(30) Foreign Application Priority Data

Aug. 4, 2000  (JP) .............................. 2000-237365
Jul. 13, 2001 (JP) .............................. 2001-213544

(51) Int. Cl.
*G11B 5/39*    (2006.01)
*G11B 5/127*   (2006.01)

(52) U.S. Cl. .................................. 360/322; 360/324.11
(58) Field of Classification Search ........... 360/324.11, 360/324.12, 324.1, 324, 322
See application file for complete search history.

(56) References Cited

U.S. PATENT DOCUMENTS

| | | | |
|---|---|---|---|
| 4,103,315 A * | 7/1978 | Hempstead et al. ......... 360/110 |
| 4,663,685 A * | 5/1987 | Tsang .................... 360/327.32 |
| 5,018,037 A * | 5/1991 | Krounbi et al. ......... 360/327.31 |
| 5,206,590 A * | 4/1993 | Dieny et al. ................. 324/252 |
| 5,438,470 A * | 8/1995 | Ravipati et al. ............. 360/322 |
| 5,608,593 A * | 3/1997 | Kim et al. ............. 360/324.12 |
| 5,699,213 A * | 12/1997 | Ohyama et al. ....... 360/327.32 |
| 5,933,297 A * | 8/1999 | Hoshiya et al. .......... 360/324.1 |
| 5,936,810 A * | 8/1999 | Nakamoto et al. ....... 360/324.1 |
| 6,040,962 A | 3/2000 | Kanazawa et al. |
| 6,141,190 A * | 10/2000 | Nakamoto et al. .......... 360/324 |
| 6,243,288 B1 * | 6/2001 | Ishikawa et al. ............ 365/158 |
| 6,407,004 B1 | 6/2002 | Kimura et al. |
| 6,519,122 B1 * | 2/2003 | Kakihara ............... 360/324.12 |
| 6,535,363 B1 * | 3/2003 | Hosomi et al. .......... 360/324.1 |

(Continued)

FOREIGN PATENT DOCUMENTS

JP    A 8-45037    2/1996

(Continued)

OTHER PUBLICATIONS

U.S. Appl. No. 09/911,407, filed Jul. 25, 2001, Inage et al.

*Primary Examiner*—Brian E. Miller
(74) *Attorney, Agent, or Firm*—Oliff & Berridge, PLC

(57) ABSTRACT

A magnetoresisive device comprises an MR element, bias field applying layers located adjacent to the side portions of the MR element, and two electrode layers that feed a sense current to the MR element. The electrode layers overlap one of the surfaces of the MR element. The total overlap amount of the two electrode layers is smaller than 0.3 μm. The MR element is a spin-valve GMR element. The MR element incorporates a base layer, a free layer, a spacer layer, a pinned layer, an antiferromagnetic layer, and a cap layer that are stacked in this order. The pinned layer includes a nonmagnetic spacer layer, and two ferromagnetic layers that sandwich this spacer layer.

12 Claims, 14 Drawing Sheets

U.S. PATENT DOCUMENTS

| | | | |
|---|---|---|---|
| 6,538,859 B1 * | 3/2003 | Gill | 360/324.12 |
| 6,545,847 B1 * | 4/2003 | Nakamoto et al. | 360/324.1 |
| 6,587,315 B1 * | 7/2003 | Aoki et al. | 360/322 |
| 6,731,478 B1 * | 5/2004 | Nakamoto et al. | 360/324.1 |

FOREIGN PATENT DOCUMENTS

| | | |
|---|---|---|
| JP | A-8-77517 | 3/1996 |
| JP | A 9-282618 | 10/1997 |
| JP | A 11-31313 | 2/1999 |
| JP | A 2000-76629 | 3/2000 |
| JP | A 2000-187813 | 7/2000 |
| JP | A-2000-276719 | 10/2000 |
| JP | A-2000-285414 | 10/2000 |
| JP | A 2000-332318 | 11/2000 |
| JP | A-2001-14615 | 1/2001 |
| JP | A-2001-28442 | 1/2001 |

* cited by examiner

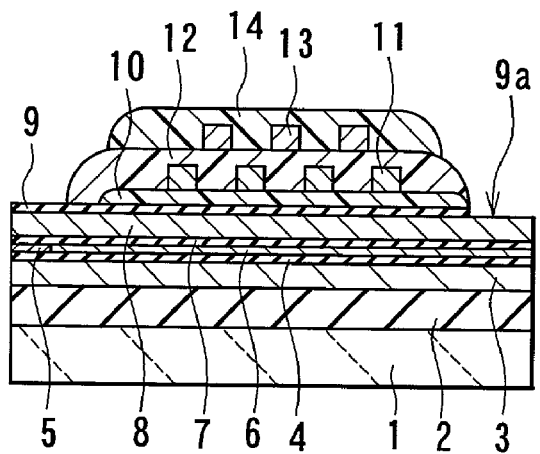
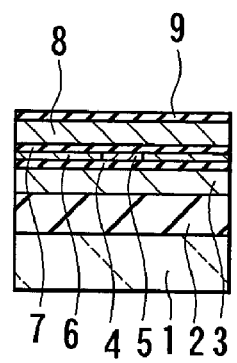
FIG. 3A          FIG. 3B
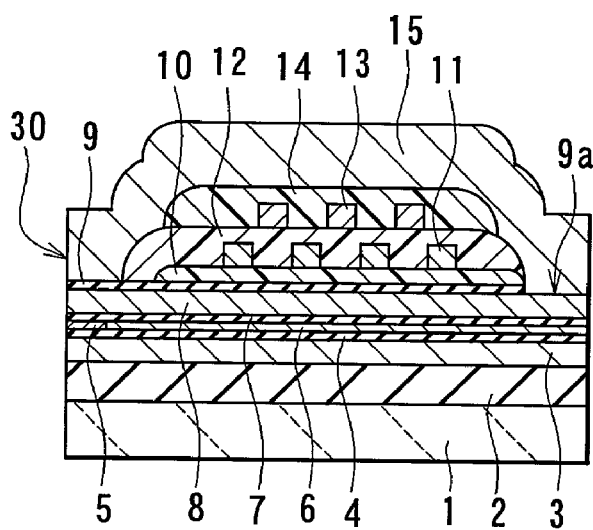
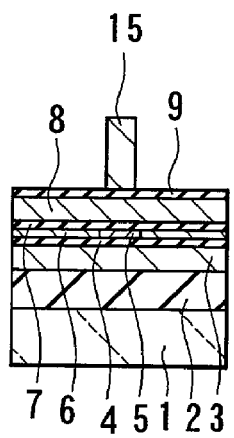
FIG. 4A          FIG. 4B

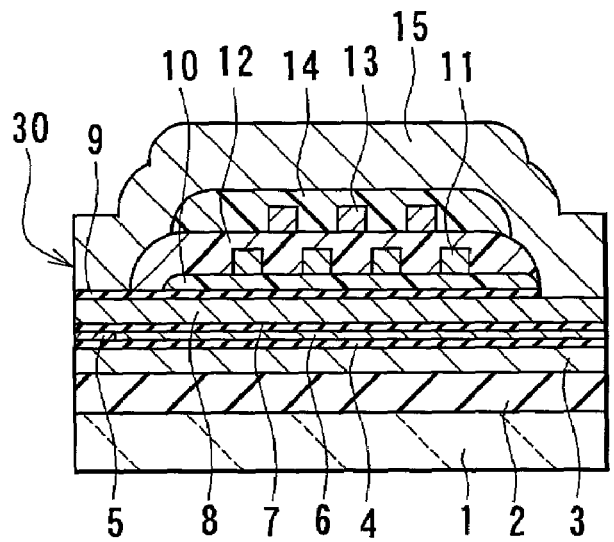 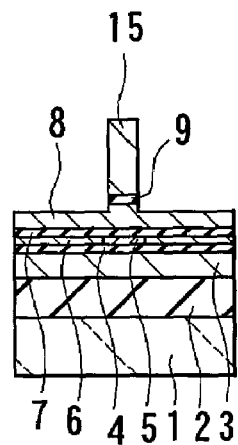
FIG. 5A    FIG. 5B
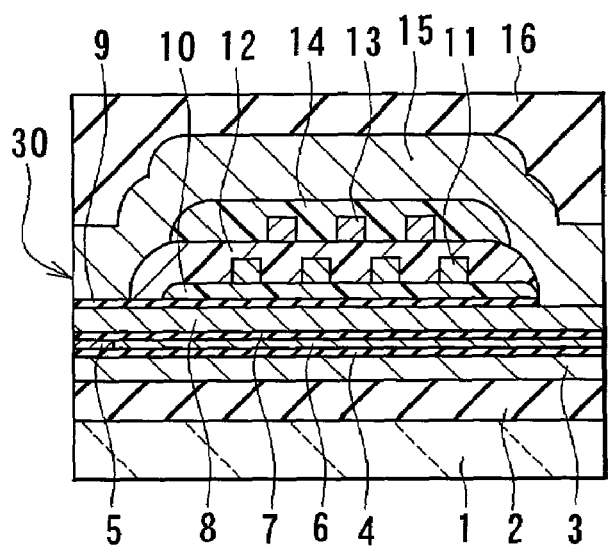 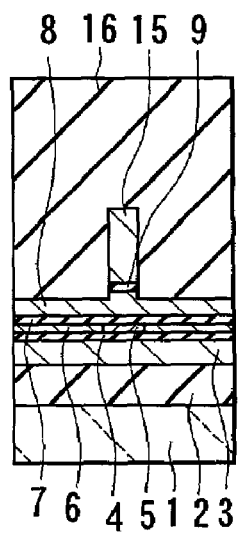
FIG. 6A    FIG. 6B

MAGNETORESISTIVE DEVICE IN A THIN-FILM MAGNETIC HEAD AND METHOD OF MANUFACTURING SAME HAVING PARTICULAR ELECTRODE OVERLAY CONFIGURATION

BACKGROUND OF THE INVENTION

1. Field of the Invention

The present invention relates to a magnetoresistive device that incorporates a magnetoresistive element and a method of manufacturing such a magnetoresistive device, and to a thin-film magnetic head that incorporates a magnetoresistive element and a method of manufacturing such a thin-film magnetic head.

2. Description of the Related Art

Performance improvements in thin-film magnetic heads have been sought as areal recording density of hard disk drives has increased. Such thin-film magnetic heads include composite thin-film magnetic heads that have been widely used. A composite head is made of a layered structure including a write (recording) head having an induction-type electromagnetic transducer for writing and a read (reproducing) head having a magnetoresistive (MR) element for reading.

MR elements include: an AMR element that utilizes the anisotropic magnetoresistive effect; a GMR element that utilizes the giant magnetoresistive effect; and a TMR element that utilizes the tunnel magnetoresistive effect.

Read heads that exhibit a high sensitivity and a high output are required. Read heads that meet these requirements are GMR heads incorporating spin-valve GMR elements. Such GMR heads have been mass-produced.

Another characteristic required for read heads is a small Barkhausen noise. Barkhausen noise results from transition of a domain wall of a magnetic domain of an MR element. If Barkhausen noise occurs, an abrupt variation in output results, which induces a reduction in signal-to-noise (S/N) ratio and an increase in error rate.

To reduce Barkhausen noise, a bias magnetic field (that may be hereinafter called a longitudinal bias field) is applied to the MR element along the longitudinal direction. To apply a longitudinal bias field to the MR element, bias field applying layers may be provided on both sides of the MR element, for example. Each of the bias field applying layers is made of a hard magnetic layer or a laminate of a ferromagnetic layer and an antiferromagnetic layer, for example.

In a read head in which bias field applying layers are provided on both sides of the MR element, two electrode layers for feeding a current used for signal detection (that may be hereinafter called a sense current) to the MR element are located to touch the bias field applying layers.

As disclosed in Published Unexamined Japanese Patent Application Heisei 11-31313 (1999), it is known that, when the bias field applying layers are located on both sides of the MR element, regions that may be hereinafter called dead regions are created near ends of the MR element that are adjacent to the bias field applying layers. In these regions the magnetic field produced from the bias field applying layers fixes the direction of magnetization, and sensing of a signal magnetic field is thereby prevented.

Consequently, if the electrode layers are located so as not to overlap the MR element, a sense current passes through the dead regions. The output of the read head is thereby reduced.

To solve this problem, the electrode layers are located to overlap the MR element, as disclosed in Published Unexamined Japanese Patent Application Heisei 8-45037 (1996), Published Unexamined Japanese Patent Application Heisei 9-282618 (1997), Published Unexamined Japanese Patent Application Heisei 11-31313 (1999), and Published Unexamined Japanese Patent Application 2000-76629, for example.

Attention is now focused on the length of the region of one of the electrode layers that is laid over the MR element, that is, the distance between an end of the one of the electrode layers and one of the ends of the MR element that corresponds to this end of the one of the electrode layers. This length or distance is hereinafter called an overlap amount. No particular range of overlap amount is disclosed in Published Unexamined Japanese Patent Application Heisei 8-45037. The range of overlap amount disclosed in Published Unexamined Japanese Patent Application Heisei 9-282618 is 0.25 to 2 µm. The range of overlap amount disclosed in Published Unexamined Japanese Patent Application Heisei 11-31313 is 0.15 to 0.5 µm. The range of overlap amount disclosed in Published Unexamined Japanese Patent Application 2000-76629 is 0.15 to 5 µm.

It is possible to reduce Barkhausen noise while a reduction in output of the read head is prevented, if the read head has a structure that the bias field applying layers are located on both sides of the MR element, and the electrode layers overlap the MR element, as described above. Such a structure is hereinafter called an overlapping electrode layer structure.

In general, a spin-valve GMR element incorporates: a nonmagnetic layer having two surfaces that face toward opposite directions; a soft magnetic layer that is located adjacent to one of the surfaces of the nonmagnetic layers; a ferromagnetic layer that is located adjacent to the other of the surfaces of the nonmagnetic layers; and an antiferromagnetic layer that is located adjacent to one of surfaces of the ferromagnetic layer that is farther from the nonmagnetic layer. The soft magnetic layer is a layer in which the direction of magnetization varies in response to a signal field, and is called a free layer. The ferromagnetic layer is a layer in which the direction of magnetization is fixed by the field produced from the antiferromagnetic layer, and is called a pinned layer.

The inventors of the present invention found out that, in the read head of the overlapping electrode layer structure that incorporates the spin-valve GMR element having the above-mentioned structure, the state of magnetization in the free layer is uneven, and it is thereby impossible to fully reduce Barkhausen noise. The reason for the uneven magnetization in the free layer will be described in detail in the description of preferred embodiments of the invention.

The inventors of the invention found out that, in the read head of the overlapping electrode layer structure, there is a difference between the space between the two electrodes, that is, the optical magnetic read track width, and the effective magnetic read track width. Furthermore, in the ranges of overlap amount disclosed in the above-mentioned publications, there is a great difference between the optical magnetic read track width and the effective magnetic read track width, and there is a great variation in effective magnetic read track width, which is a problem that affects the properties of the read head and the yield.

According to a technique disclosed in Published Unexamined Japanese Patent Application 2000-187813, the ratio L1/L2 is 0 to 10% wherein L2 is the width of the sensing portion of the spin-valve film and L1 is the length of the permanent magnet film and the electrode film that overlap the sensing portion. This technique is aimed at preventing noise caused by the permanent magnet film overlapping the spin-valve film. Although the structure in which only the permanent magnet film overlaps the sensing portion and the structure in which the permanent magnet film and the electrode film overlap the sensing portion are disclosed in this publication, the structure in which only the electrode film overlaps the sensing portion while the permanent magnet film does not overlap the sensing portion is not disclosed.

OBJECTS AND SUMMARY OF THE INVENTION

It is a first object of the invention to provide a magnetoresistive device and a thin-film magnetic head and methods of manufacturing the same, for improving the sensitivity, output and output stability.

It is a second object of the invention to provide a magnetoresistive device and a thin-film magnetic head and methods of manufacturing the same, for determining the effective read track width with precision, in addition to the first object.

A magnetoresistive device or a thin-film magnetic head of the invention comprises: a magnetoresistive element having two surfaces that face toward opposite directions and two side portions that connect the two surfaces to each other; two bias field applying layers that are located adjacent to the side portions of the magnetoresistive element and apply a bias magnetic field to the magnetoresistive element; and two electrode layers that feed a current used for signal detection to the magnetoresistive element, each of the electrode layers being adjacent to one of surfaces of each of the bias field applying layers. At least one of the electrode layers overlaps one of the surfaces of the magnetoresistive element. The magnetoresistive element incorporates: a nonmagnetic layer having two surfaces that face toward opposite directions; a soft magnetic layer adjacent to one of the surfaces of the nonmagnetic layer; a pinned layer, located adjacent to the other one of the surfaces of the nonmagnetic layer, whose direction of magnetization is fixed; and an antiferromagnetic layer located adjacent to one of surfaces of the pinned layer that is farther from the nonmagnetic layer, the antiferromagnetic layer fixing the direction of magnetization of the pinned layer. The pinned layer includes a nonmagnetic spacer layer and two ferromagnetic layers that sandwich the spacer layer and have directions of magnetization fixed to opposite directions.

According to the magnetoresistive device or the thin-film magnetic head of the invention, the bias field applying layers are located adjacent to the side portions of the magnetoresistive element. At least one of the two electrode layers overlaps one of the surfaces of the magnetoresistive element. In addition, the magnetoresistive element has the above-described configuration. As a result, the sensitivity, output, and output stability of the magnetoresistive device or the thin-film magnetic head improve.

According to the magnetoresistive device or the thin-film magnetic head of the invention, a total length of regions of the two electrode layers that are laid over the one of the surfaces of the magnetoresistive element may be smaller than 0.3 µm. In this case, both of the two electrode layers may overlap the one of the surfaces of the magnetoresistive element, and a length of the region of each of the two electrode layers that is laid over the one of the surfaces of the magnetoresistive element may be smaller than 0.15 µm.

According to the magnetoresistive device or the thin-film magnetic head of the invention, the two bias field applying layers may be located off one of the surfaces of the magnetoresistive element.

According to the magnetoresistive device or the thin-film magnetic head of the invention, a space between the two electrode layers may be equal to or smaller than approximately 0.6 µm.

A method of the invention is provided for manufacturing a magnetoresistive device comprising: a magnetoresistive element having two surfaces that face toward opposite directions and two side portions that connect the two surfaces to each other; two bias field applying layers that are located adjacent to the side portions of the magnetoresistive element and apply a bias magnetic field to the magnetoresistive element; and two electrode layers that feed a current used for signal detection to the magnetoresistive element, each of the electrode layers being adjacent to one of surfaces of each of the bias field applying layers.

A method of the invention is provided for manufacturing a thin-film magnetic head comprising: a magnetoresistive element having two surfaces that face toward opposite directions and two side portions that connect the two surfaces to each other; two bias field applying layers that are located adjacent to the side portions of the magnetoresistive element and apply a bias magnetic field to the magnetoresistive element; and two electrode layers that feed a current used for signal detection to the magnetoresistive element, each of the electrode layers being adjacent to one of surfaces of each of the bias field applying layers.

The method of manufacturing the magnetoresistive device or the method of manufacturing the thin-film magnetic head of the invention includes the steps of: forming the magnetoresistive element; forming the bias field applying layers; and forming the electrode layers. At least one of the electrode layers are located to overlap one of the surfaces of the magnetoresistive element. The magnetoresistive element incorporates: a nonmagnetic layer having two surfaces that face toward opposite directions; a soft magnetic layer adjacent to one of the surfaces of the nonmagnetic layer; a pinned layer, located adjacent to the other one of the surfaces of the nonmagnetic layer, whose direction of magnetization is fixed; and an antiferromagnetic layer located adjacent to one of surfaces of the pinned layer that is farther from the nonmagnetic layer, the antiferromagnetic layer fixing the direction of magnetization of the pinned layer. The pinned layer includes a nonmagnetic spacer layer and two ferromagnetic layers that sandwich the spacer layer and have directions of magnetization fixed to opposite directions.

According to the method of manufacturing the magnetoresistive device or the method of manufacturing the thin-film magnetic head of the invention, the bias field applying layers are located adjacent to the side portions of the magnetoresistive element. At least one of the two electrode layers overlaps one of the surfaces of the magnetoresistive element. In addition, the magnetoresistive element has the above-described configuration. As a result, the sensitivity, output, and output stability of the magnetoresistive device or the thin-film magnetic head improve.

According to the method of manufacturing the magnetoresistive device or the method of manufacturing the thin-film magnetic head of the invention, a total length of regions of the two electrode layers that are laid over the one of the surfaces of the magnetoresistive element may be smaller than 0.3 µm. In this case, both of the two electrode layers may overlap the one of the surfaces of the magnetoresistive element, and a length of the region of each of the two electrode layers that is laid over the one of the surfaces of the magnetoresistive element may be smaller than 0.15 µm.

According to the method of manufacturing the magnetoresistive device or the method of manufacturing the thin-film magnetic head of the invention, the two bias field applying layers may be located off one of the surfaces of the magnetoresistive element.

According to the method of manufacturing the magnetoresistive device or the method of manufacturing the thin-film magnetic head of the invention, a space between the two electrode layers may be equal to or smaller than approximately 0.6 µm.

Other and further objects, features and advantages of the invention will appear more fully from the following description.

BRIEF DESCRIPTION OF THE DRAWINGS

FIG. 3A and FIG. 3B are cross sections for illustrating a step of a method of manufacturing the thin-film magnetic head of the first embodiment.

FIG. 4A and FIG. 4B are cross sections for illustrating a step that follows FIG. 3A and FIG. 3B.

FIG. 5A and FIG. 5B are cross sections for illustrating a step that follows FIG. 4A and FIG. 4B.

FIG. 6A and FIG. 6B are cross sections of the thin-film magnetic head of the first embodiment.

DETAILED DESCRIPTION OF THE PREFERRED EMBODIMENTS

Figure 1:
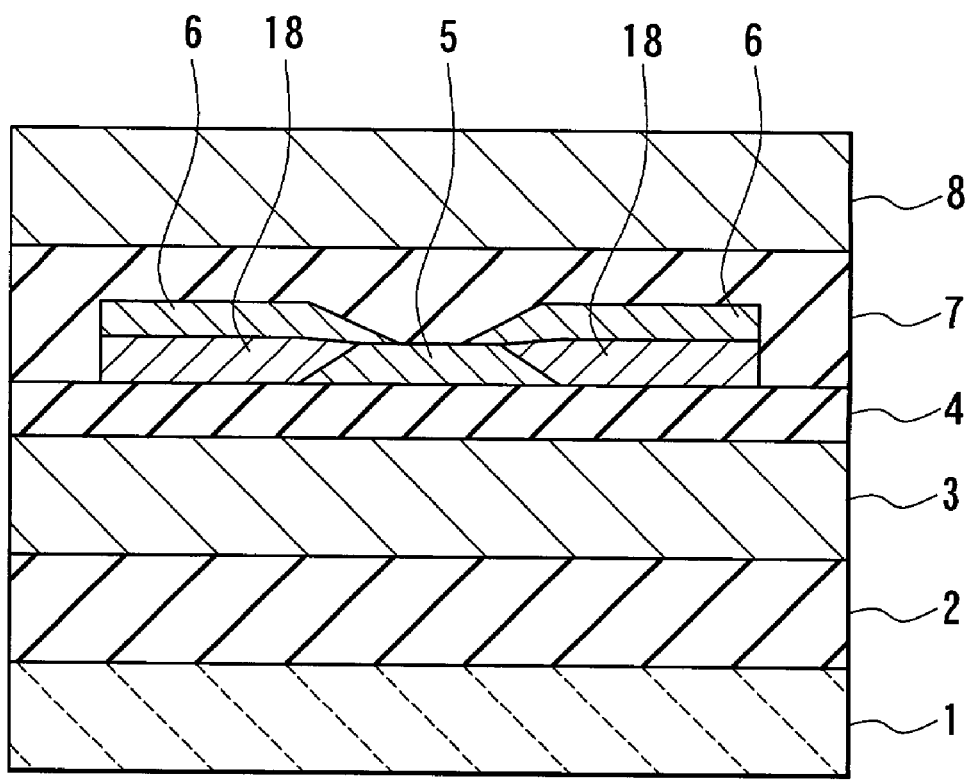
FIG. 1 is a cross section of a magnetoresistive device of a first embodiment of the invention that is parallel to the air bearing surface.

Preferred embodiments of the invention will now be described in detail with reference to the accompanying drawings.

First Embodiment

Reference is now made to FIG. 3A to FIG. 6A and FIG. 3B to FIG. 6B to describe a thin-film magnetic head and an outline of a method of manufacturing the same of a first embodiment of the invention. FIG. 3A to FIG. 6A are cross sections each orthogonal to the air bearing surface. FIG. 3B to FIG. 6B are cross sections of the pole portion each parallel to the air bearing surface.

In the manufacturing method, as shown in FIG. 3A and FIG. 3B, an insulating layer 2 made of an insulating material such as alumina ($Al_2O_3$) or silicon dioxide ($SiO_2$) whose thickness is 1 to 20 μm, for example, is formed through sputtering, for example, on a substrate 1 made of a ceramic material such as aluminum oxide and titanium carbide ($Al_2O_3$—TiC). On the insulating layer 2 a bottom shield layer 3 made of a magnetic material and having a thickness of 0.1 to 5 μm, for example, is formed for making a read head. The bottom shield layer 3 is made of a magnetic material such as FeAlSi, NiFe, CoFe, CoFeNi, FeN, FeZrN, FeTaN, CoZrNb, or CoZrTa. The bottom shield layer 3 is formed through sputtering or plating.

Next, on the bottom shield layer 3, a bottom shield gap film 4 made of an insulating material such as $Al_2O_3$ or $SiO_2$ and having a thickness of 10 to 200 nm, for example, is formed through sputtering, for example. On the bottom shield gap film 4, a magnetoresistive (MR) element 5 for reading having a thickness of tens of nanometers, for example, is formed through sputtering, for example. Next, although not shown, two bias field applying layers that are located adjacent to sides of the MR element 5 are formed on the bottom shield gap film 4 through sputtering, for example. The bias field applying layers apply a longitudinal bias magnetic field to the MR element 5. Next, on the bottom shield gap film 4 and the bias field applying layers, a pair of electrode layers 6 having a thickness of tens of nanometers are formed through sputtering, for example. The electrode layers 6 are electrically connected to the MR element 5. Next, a top shield gap film 7 made of an insulating material such as $Al_2O_3$ or $SiO_2$ and having a thickness of about 10 to 200 nm, for example, is formed through sputtering, for example, on the bottom shield gap film 4 and the MR element 5.

The above-mentioned layers making up the read head are patterned through the general etching method using a resist pattern, the liftoff method or the method using both etching and liftoff.

Next, on the top shield gap film 7, a top-shield-layer-cum-bottom-pole-layer (called a top shield layer in the following description) 8 is formed. The top shield layer 8 has a thickness of 0.5 to 4.0 μm, for example, and is made of a magnetic material and used for both read head and write head. The top shield layer 8 is made of a soft magnetic material such as NiFe, CoFe, CoFeNi or FeN, and formed through sputtering or plating, for example.

Next, a write gap layer 9 made of an insulating material such as $Al_2O_3$ or $SiO_2$ and having a thickness of 10 to 500 nm, for example, is formed through sputtering, for example, on the top shield layer 8. Next, a portion of the gap layer 9 located in a center portion of a thin-film coil described later is etched to form a contact hole 9a for making a magnetic path.

Next, an insulating layer 10 made of a thermoset photoresist, for example, is formed in a portion in which the thin-film coil is to be formed on the gap layer 9. Next, a first layer 11 of the thin-film coil made of a conductive material such as Cu is formed by frame plating, for example, on the insulating layer 10. An insulating layer 12 made of a thermoset photoresist, for example, is formed to cover the insulating layer 10 and the first layer 11 of the coil. Next, a second layer 13 of the thin-film coil made of a conductive material such as Cu is formed by frame plating, for example, on the insulating layer 12. An insulating layer 14 made of a thermoset photoresist, for example, is formed to cover the insulating layer 12 and the second layer 13 of the coil. The first layer 11 and the second layer 13 of the coil are connected to each other and wound around the contact hole 9a. For example, the total thickness of the first layer 11 and the second layer 13 is 2 to 5 μm and the total thickness of the insulating layers 10, 12 and 14 is 3 to 20 μm.

Next, as shown in FIG. 4A and FIG. 4B, a top pole layer 15 made of a magnetic material and having a thickness of 3 to 5 μm, for example, is formed for the write head. The top pole layer 15 extends from the air bearing surface (the medium facing surface) 30 through the top of the insulating layers 12 and 14 to the contact hole 9a. The top pole layer 15 is made of a soft magnetic material such as NiFe, CoFe, CoFeNi or FeN.

The bottom pole layer (the top shield layer 8) and the top pole layer 15 include portions that are opposed to each other, the gap layer 9 being located between these portions, and located on a side of the air bearing surface 30. These portions are the pole portion of the bottom pole layer (the top shield layer 8) and the pole portion of the top pole layer 15. In this embodiment the pole portion of the top pole layer 15 has a width equal to the write track width and defines the write track width. The bottom pole layer (the top shield layer 8) and the top pole layer 15 are magnetically coupled to each other through the contact hole 9a.

Next, as shown in FIG. 5A and FIG. 5B, the gap layer 9 is selectively etched through dry etching, using the pole portion of the top pole layer 15 as a mask. This dry etching may be reactive ion etching (RIE) using a chlorine-base gas such as $BCl_2$ or $Cl_2$, or a fluorine-base gas such as $CF_4$ or $SF_6$, for example. Next, the top shield layer 8 is selectively etched by about 0.3 to 0.6 μm, for example, through argon ion milling, for example. A trim structure as shown in FIG. 5B is thus formed. The trim structure suppresses an increase in the effective track width due to expansion of a magnetic flux generated during writing in a narrow track.

Next, as shown in FIG. 6A and FIG. 6B, a protection layer 16 made of an insulating material such as $Al_2O_3$ or $SiO_2$ and having a thickness of 5 to 50 μm, for example, is formed over the entire surface through sputtering, for example. The surface of the protection layer 16 is flattened and pads (not shown) for electrodes are formed thereon. Finally, lapping of the slider including the foregoing layers is performed to form the air bearing surface 30 of the thin-film magnetic head including the write head and the read head. The thin-film magnetic head of the embodiment is thus completed.

The thin-film magnetic head of the embodiment manufactured through the foregoing steps comprises the medium facing surface that faces toward a recording medium (the air bearing surface 30), the read head and the write head. The read head incorporates: the MR element 5; and the bottom shield layer 3 and the top shield layer 8 for shielding the MR element 5. Portions of the bottom shield layer 3 and the top shield layer 8 that are located on a side of the air bearing surface 30 are opposed to each other, the MR element 5 being placed between these portions. The read head corresponds to the magnetoresistive device of this embodiment, too.

The write head incorporates the bottom pole layer (the top shield layer 8) and the top pole layer 15 that are magnetically coupled to each other, each of which includes at least one layer. The bottom pole layer and the top pole layer 15 include the pole portions that are opposed to each other and placed in regions on a side of the air bearing surface 30. The write head further incorporates: the write gap layer 9 placed between the pole portion of the bottom pole layer and the pole portion of the top pole layer 15; and the thin-film coil (made up of the layers 11 and 13) at least a part of which is placed between the bottom pole layer and the top pole layer 15, the at least part of the coil being insulated from the bottom pole layer and the top pole layer 15. The pole portion of the top pole layer 15 defines the write track width.

Reference is now made to FIG. 1 to describe the configuration of the read head of this embodiment, that is, the magnetoresistive device of this embodiment and the method of manufacturing the same in detail. FIG. 1 is a cross section of the magnetoresistive device that is parallel to the air bearing surface.

As shown in FIG. 1, the magnetoresistive device of the embodiment comprises: the MR element 5 having the two surfaces that face toward opposite directions and the two side portions that connect the two surfaces to each other; the two bias field applying layers 18 that are located adjacent to the side portions of the MR element 5 and apply a longitudinal bias field to the MR element 5; and the two electrode layers 6 that feed a sense current used for signal detection to the MR element 5, each of the electrode layers 6 being adjacent to one of the surfaces of each of the bias field applying layers 18. Although in FIG. 1 the electrode layers 6 are located on top of the bias field applying layers 18, the electrode layers 6 are located on the bottom shield gap film 4 in the region in which the bias field applying layers 18 are not located. The magnetoresistive device is covered with the bottom shield gap film 4 and the top shield gap film 7.

The method of manufacturing the magnetoresistive device includes the steps of: forming the MR element 5 on the bottom shield gap film 4; forming the bias field applying layers 18 on the bottom shield gap film 4; and forming the electrode layers 6 on the bottom shield gap film 4 and the bias field applying layers 18.

According to this embodiment, at least one of the electrode layers 6 is located such that a part thereof is laid over one of the surfaces of the MR element 5 (that is, at least one of the electrode layers 6 overlaps one of the surfaces of the MR element 5). The total length of the regions of the two electrode layers 6 that overlap the one of the surfaces of the MR element 5 is smaller than 0.3 µm. The length of the region of one of the electrode layers 6 that overlaps the one of the surfaces of the MR element 5 (hereinafter called an overlap amount) is the distance between an end of the one of the electrode layers 6 and one of the ends of the MR element 5 that corresponds to this end of the one of the electrode layers 6. In this embodiment neither of the two bias field applying layers 18 overlaps one of the surfaces of the MR element 5.

Figure 2:
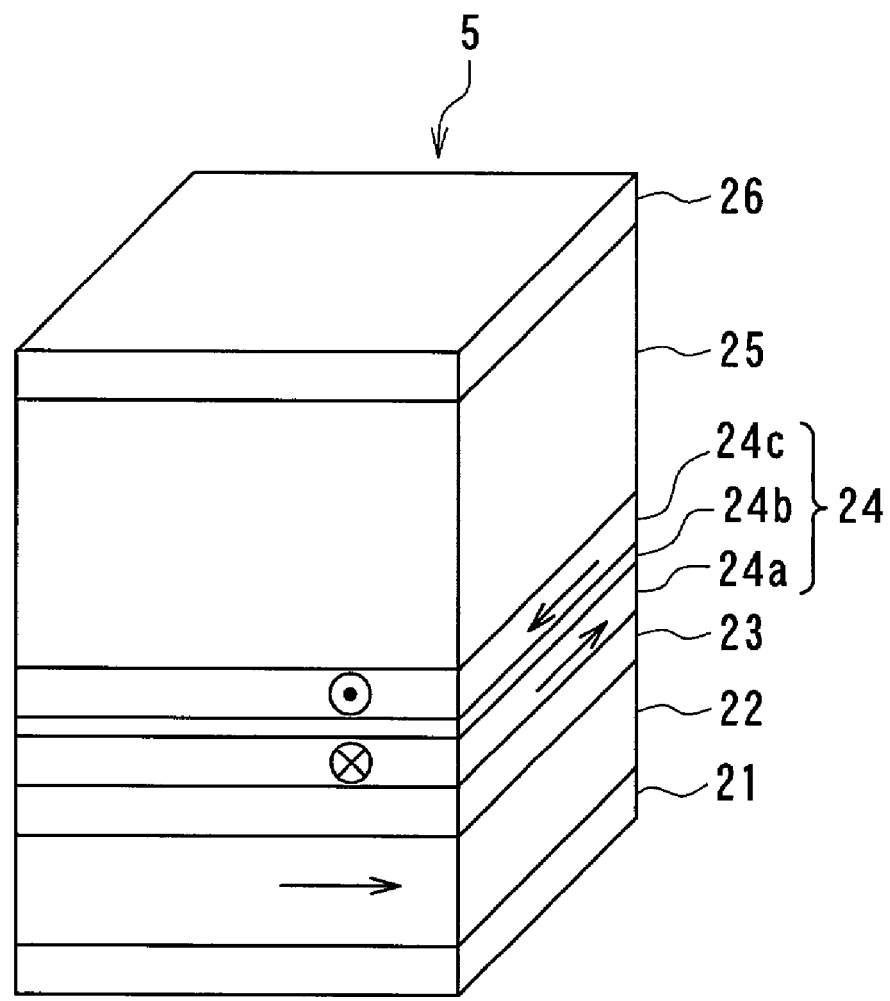
FIG. 2 is a perspective view that illustrates the configuration of the MR element of the first embodiment.

FIG. 2 is a perspective view that illustrates the configuration of layers of the MR element 5 of this embodiment. The MR element 5 is a spin-valve GMR element. The MR element 5 includes: a base layer 21; a free layer 22, made of a soft magnetic layer, in which the direction of magnetization varies in response to the signal magnetic field supplied from the recording medium; a spacer layer 23 made of a nonmagnetic conductive layer; a pinned layer 24 whose direction of magnetization is fixed; an antiferromagnetic layer 25 that fixes the direction of magnetization of the pinned layer 24; and a cap layer 26. The MR element 5 is fabricated through stacking these layers one by one on the bottom shield gap film 4.

As thus described, the MR element 5 includes: the spacer layer (the nonmagnetic layer) 23 having two surfaces that face toward opposite directions; the free layer (the soft magnetic layer) 22 that is adjacent to one of the surfaces (the bottom surface) of the spacer layer 23; the pinned layer 24, located adjacent to the other one of the surfaces (the top surface) of the spacer layer 23, whose direction of magnetization is fixed; and the antiferromagnetic layer 25 that is adjacent to one of the surfaces of the pinned layer 24 farther from the spacer layer 23, and fixes the direction of magnetization of the pinned layer 24.

According to the embodiment, the pinned layer 24 includes: a nonmagnetic spacer layer 24b; and two ferromagnetic layers 24a and 24c that sandwich the spacer layer 24b. The pinned layer 24 is fabricated through stacking the ferromagnetic layer 24a, the spacer layer 24b and the ferromagnetic layer 24c one by one on the spacer layer 23. The two ferromagnetic layers 24a and 24c are antiferromagnetic-coupled to each other and exhibit magnetizations whose directions are fixed in opposite directions.

The base layer 21 has a thickness of 4 to 6 nm, for example, and is made of Ta or NiCr, for example.

The free layer 22 has a thickness of 3 to 8 nm, for example, and may be made up of a single layer or two layers or more. An example in which the free layer 22 is made up of two soft magnetic layers will now be given. One of the two layers that is closer to the base layer 21 is called a first soft magnetic layer. The other one that is closer to the spacer layer 23 is called a second soft magnetic layer.

The first soft magnetic layer has a thickness of 1 to 8 nm, for example, and may be made of a magnetic material including at least Ni among the group consisting of Ni, Co, Fe, Ta, Cr, Rh, Mo and Nb. To be specific, the first soft magnetic layer is preferably made of $[Ni_xCo_yFe_{100-(x+y)}]_{100-z}M_I$. $M_I$ represents at least one of Ta, Cr, Rh, Mo and Nb. In the formula, x, y and z fall within the ranges of $75 \leq x \leq 90$, $0 \leq y \leq 15$, and $0 \leq z \leq 15$, respectively, in atomic percent.

The second soft magnetic layer has a thickness of 0.5 to 3 nm, for example, and may be made of a magnetic material including at least Co among the group consisting of Ni, Co, and Fe. To be specific, the second soft magnetic layer is preferably made of $Co_xFe_yNi_{100-(x+y)}$ in which the (111) plane is oriented along the direction in which the layers are stacked. In the formula, x and y fall within the ranges of $70 \leq x \leq 100$ and $0 \leq y \leq 25$, respectively, in atomic percent.

The spacer layer 23 has a thickness of 1.8 to 3.0 nm, for example, and may be made of a nonmagnetic conductive material including 80 weight % or greater of at least one of the elements among the group consisting of Cu, Au, and Ag.

The ferromagnetic layers 24a and 24c of the pinned layer 24 may be made of a ferromagnetic material including at least Co among the group consisting of Co and Fe. In particular, it is preferred that the (111) plane of this ferromagnetic material is oriented along the direction in which the layers are stacked. The total thickness of the ferromagnetic layers 24a and 24c is 3 to 4.5 nm, for example.

The nonmagnetic spacer layer 24b has a thickness of 0.2 to 1.2 nm, for example, and may be made of a nonmagnetic material including at least one element among the group consisting of Ru, Rh, Re, Cr and Zr. The nonmagnetic spacer layer 24b is provided for creating antiferromagnetic exchange coupling between the ferromagnetic layers 24a and 24c, and fixing the magnetizations of the layers 24a and 24c in opposite directions. The magnetizations of the layers 24a and 24c in opposite directions include not only the case in which there is a difference of 180 degrees between these directions of magnetizations, but also the case in which there is a difference of 180±20 degrees between them.

The antiferromagnetic layer 25 has a thickness of 5 to 30 nm, for example, and may be made of an antiferromagnetic material including Mn and at least one element $M_{II}$ among the group consisting of Pt, Ru, Rh, Pd, Ni, Au, Ag, Cu, Ir, Cr and Fe. The proportion of Mn preferably falls within the range of 35 to 95 atomic % inclusive. The proportion of $M_{II}$ preferably falls within the range of 5 to 65 atomic % inclusive. Types of antiferromagnetic material include a non-heat-induced antiferromagnetic material that exhibits ferromagnetism without any heat treatment and that induces an exchange coupling magnetic field between a ferromagnetic material and itself. Another type of antiferromagnetic material is a heat-induced antiferromagnetic material that exhibits ferromagnetism when heat treatment is given. The antiferromagnetic layer 25 may be made of either of these types.

The non-heat-induced antiferromagnetic material includes an Mn alloy that has a γ phase, such as RuRhMn, FeMn, or IrMn. The heat-induced antiferromagnetic material includes an Mn alloy that has a regular crystal structure, such as PtMn, NiMn, or PtRhMn.

The cap layer 26 has a thickness of 4 to 6 nm, for example, and may be made of Ta.

The bias field applying layers 18 of FIG. 1 are made up of hard magnetic layers (hard magnets) or a laminate of a ferromagnetic layer and an antiferromagnetic layer, for example. Here is an example of the bias field applying layers 18 made up of a laminate of a ferromagnetic layer located on the bottom shield gap film 4, and an antiferromagnetic layer formed on this ferromagnetic layer. In this case, the ferromagnetic layer has a thickness of 10 to 40 nm, for example. The ferromagnetic layer is made of NiFe, or a laminate of films made of NiFe and CoFe, or a magnetic material containing at least one element among the group consisting of Ni, Fe, and Co. The antiferromagnetic layer has a thickness of 10 to 20 nm, for example. Although the antiferromagnetic layer may be made of either a non-heat-induced antiferromagnetic material or a heat-induced antiferromagnetic material, it is preferably made of a non-heat-induced antiferromagnetic material.

The bias field applying layers 18 are not limited to the above-mentioned example but may be made of hard magnetic layers such as a laminate of TiW and CoPt or a laminate of TiW and CoCrPt.

Each of the electrode layers 6 of FIG. 1 is made of a laminate of Ta and Au, a laminate of TiW and Ta, or a laminate of TiN and Ta, for example.

The operations of the magnetoresistive device and the thin-film magnetic head of this embodiment will now be described. The thin-film magnetic head writes data on a recording medium through the use of the write head, and reads data stored on the medium through the use of the magnetoresistive device that is the read head.

As shown in FIG. 2, the direction of the bias magnetic field created by the bias field applying layers 18 of the magnetoresistive device is indicated as the X direction. The direction orthogonal to the air bearing surface 30 is indicated as the Y direction. The X and Y directions intersect at a right angle. In the MR element 5, when no signal field is applied thereto, the direction of magnetization of the free layer 22 is made equal to the X direction which is the direction of bias field. In the pinned layer 24 the direction of magnetization of the ferromagnetic layer 24c is fixed to the Y direction by the antiferromagnetic layer 25. The direction of magnetization of the ferromagnetic layer 24a is fixed to the Y direction which is opposite to the direction of magnetization of the ferromagnetic layer 24c.

In the MR element 5 the direction of magnetization of the free layer 22 changes in response to the signal field supplied from the recording medium. The relative angle between the direction of magnetization of the free layer 22 and the direction of magnetization of the ferromagnetic layer 24a is thereby changed. As a result, the resistance value of the MR element 5 is changed. The resistance value of the MR element 5 is obtained by finding the potential difference between the two electrode layers 6 when a sense current is fed to the MR element 5 from the electrode layers 6. The magnetoresistive device thus reads the data stored on the recording medium.

The following are descriptions of the definition of overlap amount of the electrode layers 6 which is one of the features of the magnetoresistive device and the thin-film magnetic head of this embodiment, and the operation and effects thereof. In the following descriptions both of the two electrode layers 6 overlap the top surface of the MR element 5. The overlap amounts of the electrode layers 6 are equal, and each of the amounts is less than 0.15 μm. In this case, the overlap amount of one of the electrode layers 6 is $L_0$.

Figure 7:
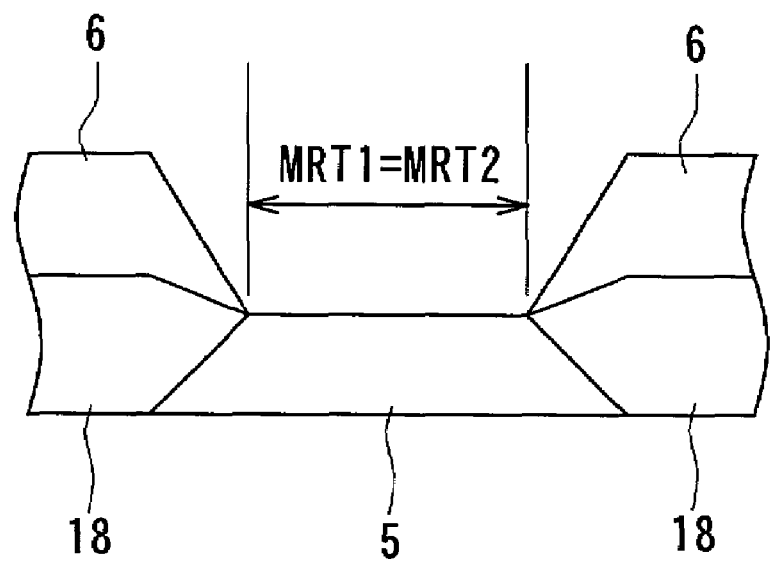
FIG. 7 illustrates a magnetoresistive device in which neither of the two electrode layers overlap the top surface of the MR element.
Figure 8:
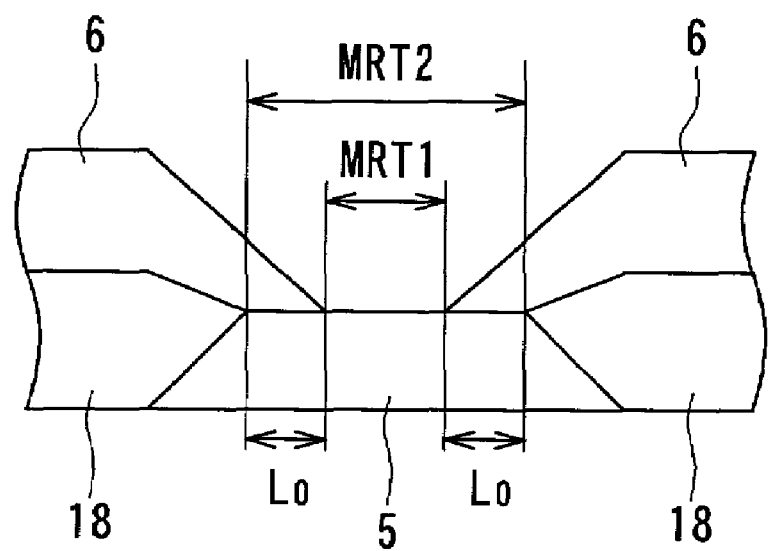
FIG. 8 illustrates a magnetoresistive device in which both of the two electrode layers overlap the top surface of the MR element.

As the recording density of hard disk drives has increased, the write track width and the read track width of thin-film magnetic heads have been required to be reduced. An experiment was therefore performed to determine the effect of the overlap amount $L_0$ of one of the electrode layers 6 of the magnetoresistive device on the read track width. In this experiment a magnetoresistive device in which the two electrode layers 6 did not overlap the top surface of the MR element 5, as shown in FIG. 7, that is, the overlap amount $L_0$ is zero, was fabricated. In addition, four types of magnetoresistive devices in which the two electrode layers 6 overlapped the top surface of the MR element 5, as shown in FIG. 8, were fabricated. The overlap amounts $L_O$ of these four types were 0.05 µm, 0.10 µm, 0.15 µm, and 0.20 µm, respectively. The number of each of those five types of magnetoresistive devices fabricated were twenty. The outputs of these devices and effective magnetic read track widths (magnetic read widths) were obtained.

In the following description, as shown in FIG. 7 and FIG. 8, the space between the two electrode layers 6 (hereinafter called the electrode space), that is, the optical magnetic read track width, is indicated with MRT1. The width of the top surface of the MR element 5 (hereinafter called the element width) is indicated with MRT2. The normalized output, that is, the output of each of the magnetoresistive devices expressed as a percent, based on the output of the magnetoresistive device of FIG. 7 whose overlap amount $L_O$ is zero, is indicated with Norm_TAA. The mean value of the effective magnetic read track width (hereinafter called the effective track width) is indicated with MRW_mean. The standard deviation of the effective track width is indicated with MRW_std. The variation in the effective track width (three times the standard deviation) is indicated with MRW_3std. The maximum value of effective track width that is expected from the variation in the effective track width is indicated with MRW_max (3std).

The effective track width was obtained from the half width of the output when the output of each read head was monitored while each thin-film magnetic head was moved across the track.

In the experiment the target value of the effective track width was 0.36 µm. The electrode space MRT1 of each of the magnetoresistive devices was 0.35 µm. The result is shown in the table below.

Figure 9:
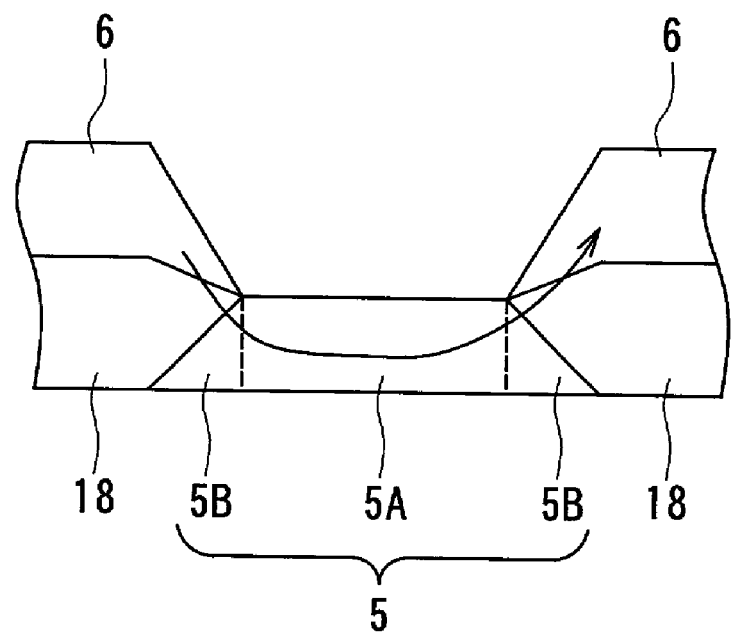
FIG. 9 illustrates the flow of a sense current in the magnetoresistive device in which neither of the two electrode layers overlap the top surface of the MR element.
Figure 10:
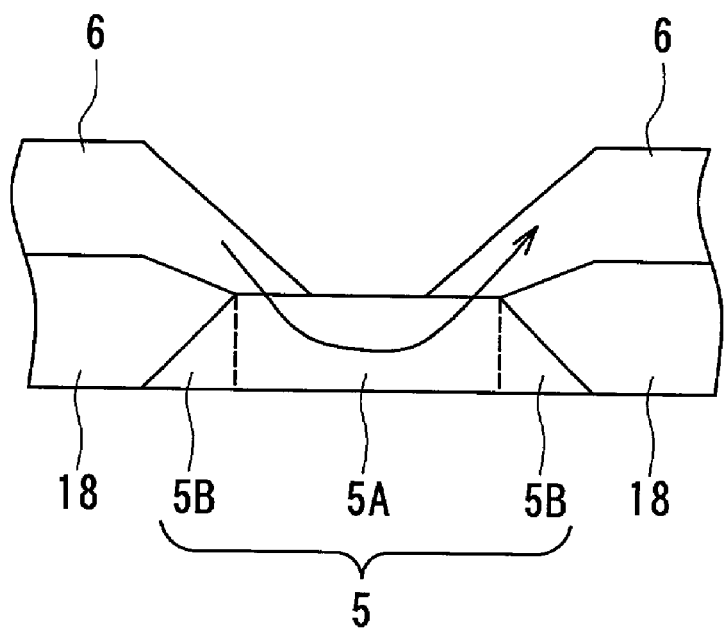
FIG. 10 illustrates the flow of a sense current in the magnetoresistive device in which both of the two electrode layers overlap the top surface of the MR element.

As shown in FIG. 9 and FIG. 10, the bias field applying layers 18 are located on both sides of the MR element 5. Consequently, regions (hereinafter called dead regions) 5B are created near ends of the MR element 5 that are adjacent to the bias field applying layers 18. In these regions the magnetic field produced from the bias field applying layers 18 fixes the direction of magnetization, and sensing of a signal magnetic field is thereby prevented. The dead regions 5B do not contribute to producing outputs of the magnetoresistive device. The region of the MR element 5 except the dead regions 5B is an active region 6A in which a signal field is detectable.

In the magnetoresistive device in which the two electrode layers 6 do not overlap the top surface of the MR element 5, as shown in FIG. 9, a sense current passes through the two dead regions 5B and the output is thereby reduced. In contrast, in the magnetoresistive device in which both of the two electrode layers 6 overlap the top surface of the MR element 5, as shown in FIG. 10, the two electrode layers 6 extend to the top of the active region 5A of the MR element 5. As a result, the proportion of sense current that passes through the dead regions 5B is smaller, compared to the magnetoresistive device of FIG. 9. In the magnetoresistive device of FIG. 10, when the resistance of the MR element 5 is reduced in response to the signal field, in particular, the sense current passes through only the active region 5A, since the current tends to pass through a region having a low resistance. As thus described, the output of the magnetoresistive device is increased when the electrode layers 6 overlap the MR element 5.

As shown in the above-listed table, the output of the magnetoresistive device increases as the overlap amount $L_O$ increases. However, if attention is drawn to the effective track width that is required as one of characteristics of the

TABLE 1

| $L_O$ [µm] | MRT 1 [µm] | MRT 2 [µm] | Norm_TAA [%] | MRW_mean [µm] | MRW_std [µm] | MRW_3std [µm] | MRW_max (3std) [µm] |
|---|---|---|---|---|---|---|---|
| 0.00 | 0.35 | 0.35 | 100 | 0.367 | 0.02 | 0.06 | 0.397 |
| 0.05 | 0.35 | 0.45 | 148 | 0.377 | 0.02 | 0.06 | 0.407 |
| 0.10 | 0.35 | 0.55 | 167 | 0.390 | 0.02 | 0.06 | 0.420 |
| 0.15 | 0.35 | 0.65 | 183 | 0.405 | 0.03 | 0.08 | 0.443 |
| 0.20 | 0.35 | 0.75 | 197 | 0.429 | 0.05 | 0.15 | 0.504 |

As shown, as the overlap amount $L_O$ increased, the output of each of the magnetoresistive devices increased. Referring to the overlap amount $L_O$ of zero, the output increased by 50% when the overlap amount $L_O$ was 0.05 µm. The output was doubled when the overlap amount $L_O$ was 0.20 µm.

Figure 11:
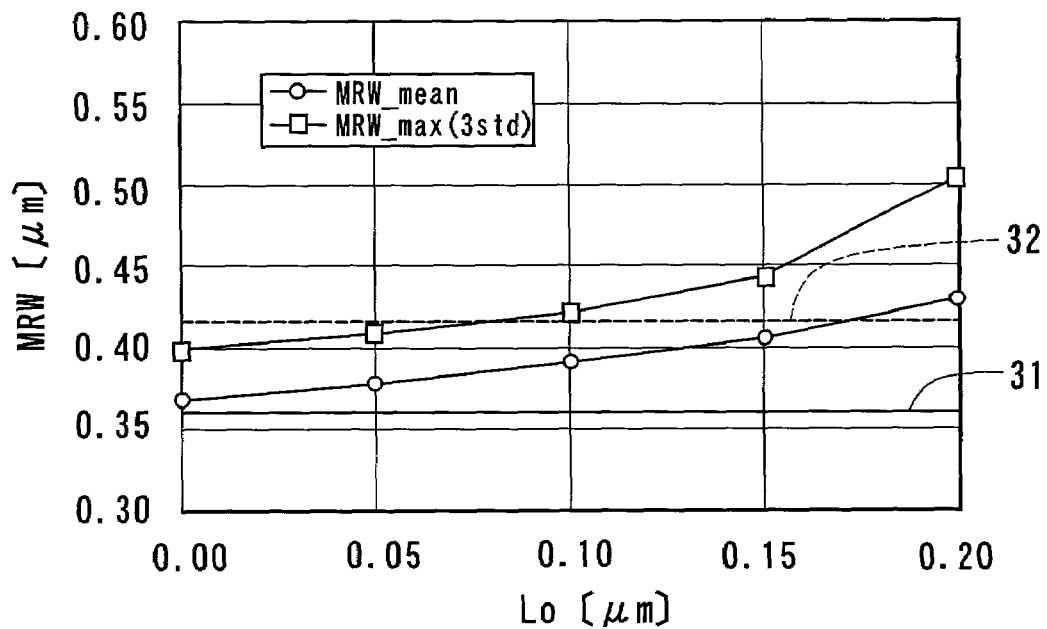
FIG. 11 is a plot that shows the relationship between the overlap amount and each of the mean value of effective track width and the maximum effective track width.

Reference is now made to FIG. 9 and FIG. 10 to describe the reason that the output of the magnetoresistive device increases when the electrode layers 6 overlap the MR element 5. FIG. 9 illustrates the flow of sense current in the magnetoresistive device in which the two electrode layers 6 do not overlap the top surface of the MR element 5. FIG. 10 illustrates the flow of sense current in the magnetoresistive device in which both of the two electrode layers 6 overlap the top surface of the MR element 5.

thin-film magnetic head, the table shows that an adverse effect on the effective track width increases as the overlap amount $L_O$ increases. To clarify this adverse effect, FIG. 11 shows the relationship between the overlap amount $L_O$ and the mean value of effective track width MRW_mean, and the relationship between the overlap amount $L_O$ and the maximum value of effective track width MRW_max (3std) that is expected from the variations in effective track width. In FIG. 11 the solid line indicated with numeral 31 shows the level of target value (0.36 µm) of effective track width. One of the specifications required for the effective track width in order to implement the characteristics of the hard disk drive is that the effective track width falls within ±15% of the target value. Therefore, the normalized maximum value is defined as ±15% of the target value (0.36 µm) of effective track width. In FIG. 11 the broken line indicated with numeral 32 shows the level of normalized maximum value.

As shown in the above-listed table and FIG. 11, although the electrode space MRT1 of 0.35 µm is constant, the mean value of effective track width MRW_mean and the variation in effective track width MRW_3std increase as the overlap amount $L_0$ increases. One of the reasons that this phenomenon occurs is that, when the overlap amount $L_0$ increases, the element width MRT2 increases while the electrode space MRT1 is constant. As a result, the effect of the longitudinal magnetic field is reduced, and the effective track width is thereby made unstable.

As shown in FIG. 11, when the overlap amount $L_0$ is 0.15 µm, the mean value of effective track width MRW_mean is extremely close to the normalized maximum value, and the maximum value of effective track width MRW_max (3std) expected from the variation in effective track width is greater than the normalized maximum value by about 0.03 µm. In this case, among entire heads that are manufactured, the proportion of heads whose effective track width are greater than the normalized maximum value is very large, and the yield of the heads is expected to be reduced.

When the overlap amount $L_0$ is 0.20 µm, the mean value of effective track width MRW_mean is greater than the normalized maximum value, and the maximum value of effective track width MRW_max (3std) is greater than the normalized maximum value by about 0.09 µm and is greater than the target value of effective track width by about 0.14 µm.

As thus described, when the electrode space MRT1 is 0.35 µm, it is not preferred that the overlap amount $L_0$ is 0.15 µm or greater, in terms of head yield.

If the electrode space MRT1 is smaller than 0.35 µm, it is possible to fabricate heads that satisfy the specifications even though the overlap amount $L_0$ is 0.15 µm or greater. However, it is technically very difficult to fabricate the electrode layers 6 if the electrode space MRT1 is smaller than 0.35 µm.

Therefore, it is preferred that the overlap amount $L_0$ is smaller than 0.15 µm, in terms of the technique of fabricating the electrode layers 6 and the head yield.

As shown in FIG. 11, when the overlap amount $L_0$ is 0.10 µm, the maximum value of effective track width MRW_max (3std) is slightly greater than the normalized maximum value. When the overlap amount $L_0$ is 0.05 µm, the maximum value of effective track width MRW_max (3std) is smaller than the normalized maximum value. Therefore, the overlap amount $L_0$ is preferably 0.10 µm or smaller, and more preferably 0.05 µm or smaller, in order to improve the head yield.

Figure 12:
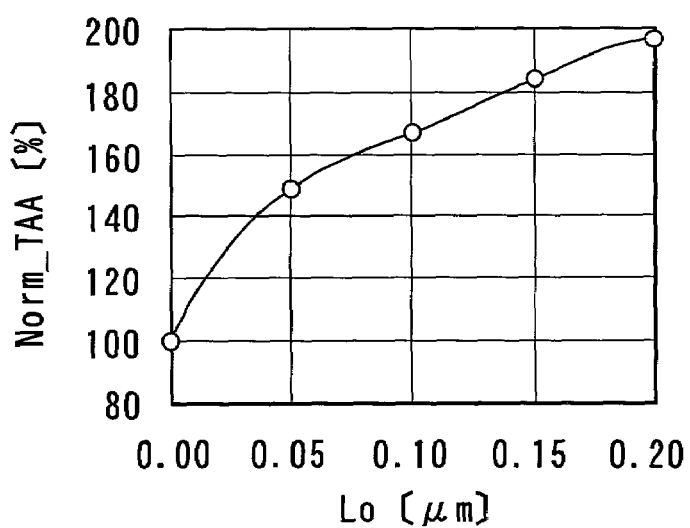
FIG. 12 is a plot that shows the relationship between the overlap amount and the normalized output.

FIG. 12 is a plot that shows the relationship between the overlap amount $L_0$ and the normalized output Norm_TAA. As shown, an improvement in output is expected if there is any small overlap amount $L_0$.

Figure 13:
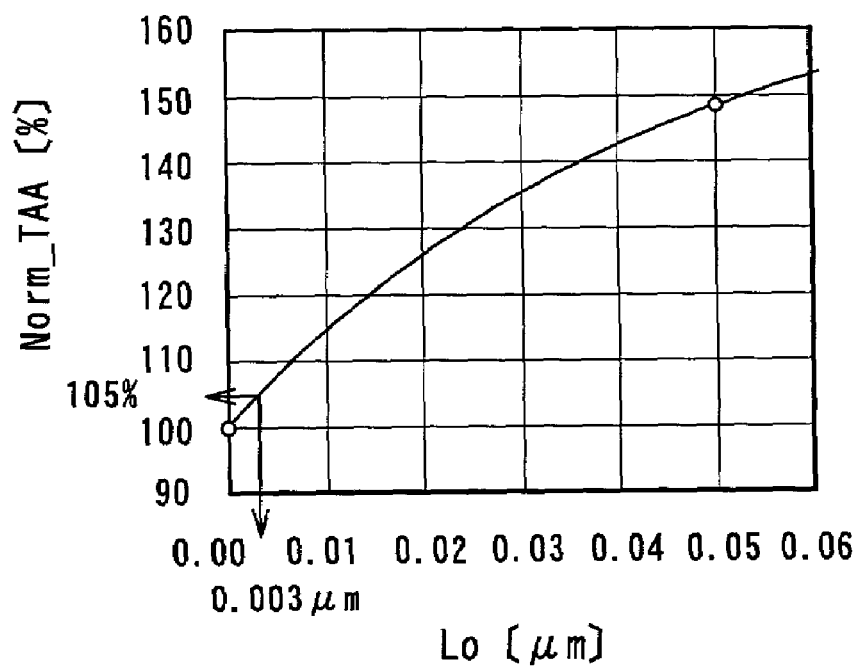
FIG. 13 is a plot that enlarges the range of FIG. 12 in which the overlap amount is 0 to 0.06 µm.

FIG. 13 is a plot that enlarges the range of FIG. 12 in which the overlap amount $L_0$ is 0 to 0.06 µm. Even if there are ±5% of measurement errors of outputs, an improvement in output is surely expected if the normalized output Norm_TAA is 105% or greater. The overlap amount $L_0$ is about 0.003 µm when the normalized output Norm_TAA is 105%. Therefore, the overlap amount $L_0$ is preferably 0.003 µm or greater.

The following are descriptions of the function and effects that are produced by the structure that the bias field applying layers 18 do not overlap the top surface of the MR element 5 while the electrode layers 6 overlap the top surface of the MR element 5, according to the magnetoresistive device and the thin-film magnetic head of this embodiment.

Figure 14:
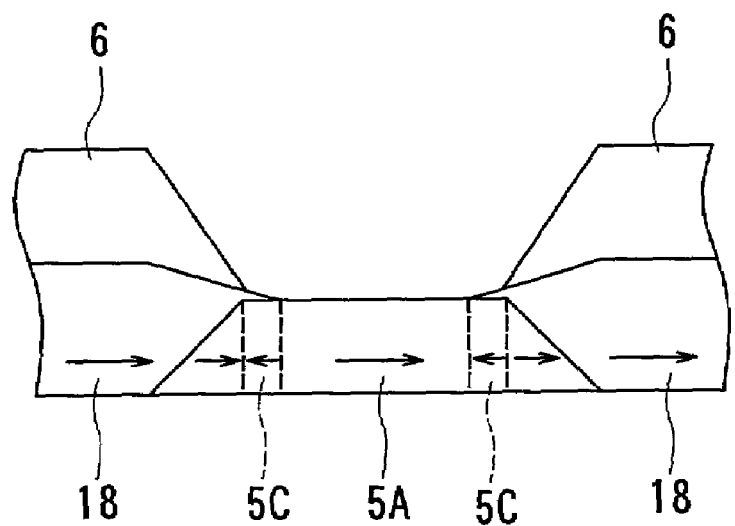
FIG. 14 illustrates a magnetoresistive device in which the bias field applying layers overlap the top surface of the MR element while the electrode layers do not overlap the top surface of the MR element.
Figure 15:
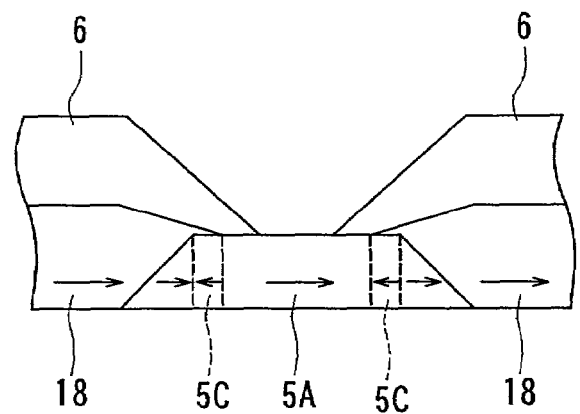
FIG. 15 illustrates a magnetoresistive device in which both of the bias field applying layers and the electrode layers overlap the top surface of the MR element.

FIG. 14 and FIG. 15 illustrate two reference examples of magnetoresistive devices that are compared with the devices of the embodiment of the invention. In the device of FIG. 14 the bias field applying layers 18 overlap the top surface of the MR element 5 while the electrode layers 6 do not overlap the top surface of the MR element 5. In the device of FIG. 15 both of the bias field applying layers 18 and the electrode layers 6 overlap the top surface of the MR element 5. As shown in FIG. 14 and FIG. 15, when the bias field applying layers 18 overlap the top surface of the MR element 5, magnetic domains 5C are created in the free layer of the MR element 5 in portions below the regions in which the layers 18 overlap the top surface of the MR element 5. In the domains 5C the direction of magnetization is opposite to the direction of magnetization that is determined by the bias field applying layers 18. As a result, the frequency of occurrence of Barkhausen noise increases. The arrows of FIG. 14 and FIG. 15 indicate the directions of magnetization.

As shown in FIG. 15, if both of the bias field applying layers 18 and the electrode layers 6 overlap the top surface of the MR element 5, the proportion of sense current that passes through the domains 5C decreases. The frequency of occurrence of Barkhausen noise is thereby made lower than that of the device of FIG. 14. However, the frequency of occurrence of Barkhausen noise of the device of FIG. 15 is still higher than that of the device in which the bias field applying layers 18 do not overlap the top surface of the MR element 5 while the electrode layers 6 overlap the top surface of the MR element 5.

An experiment was performed to confirm the above statement. In this experiment the relationship between the electrode space MRT1 and the frequency of occurrence of Barkhausen noise was obtained for four types, that is, A, B, C and D, of magnetoresistive devices. In the following description the length of the region of one of the bias field applying layers 18 that overlaps the top surface of the MR element 5 is called an overlap amount of the one of the layers 18, and indicated with $L_1$. The overlap amount of one of the electrode layers 6 is indicated with $L_0$ as in the foregoing description.

The device of type A has a structure in which neither of the bias field applying layers 18 and the electrode layers 6 overlap the top surface of the MR element 5. Each of $L_1$ and $L_0$ is 0.00 µm in type A.

The device of type B is an example of the magnetoresistive device of the embodiment of the invention in which the bias field applying layers 18 do not overlap the top surface of the MR element 5 while the electrode layers 6 overlap the top surface of the MR element 5. $L_1$ is 0.00 µm and $L_0$ is 0.10 µm in type B.

The device of type C has a structure in which both of the bias field applying layers 18 and the electrode layers 6 overlap the top surface of the MR element 5, as shown in FIG. 15. $L_1$ is 0.08 µm and $L_0$ is 0.10 µm in type C.

The device of type D has a structure in which the bias field applying layers 18 overlap the top surface of the MR element 5 while the electrode layers 6 do not, as shown in FIG. 14. $L_1$ is 0.08 µm and $L_0$ is 0.00 µm in type D.

Figure 16:
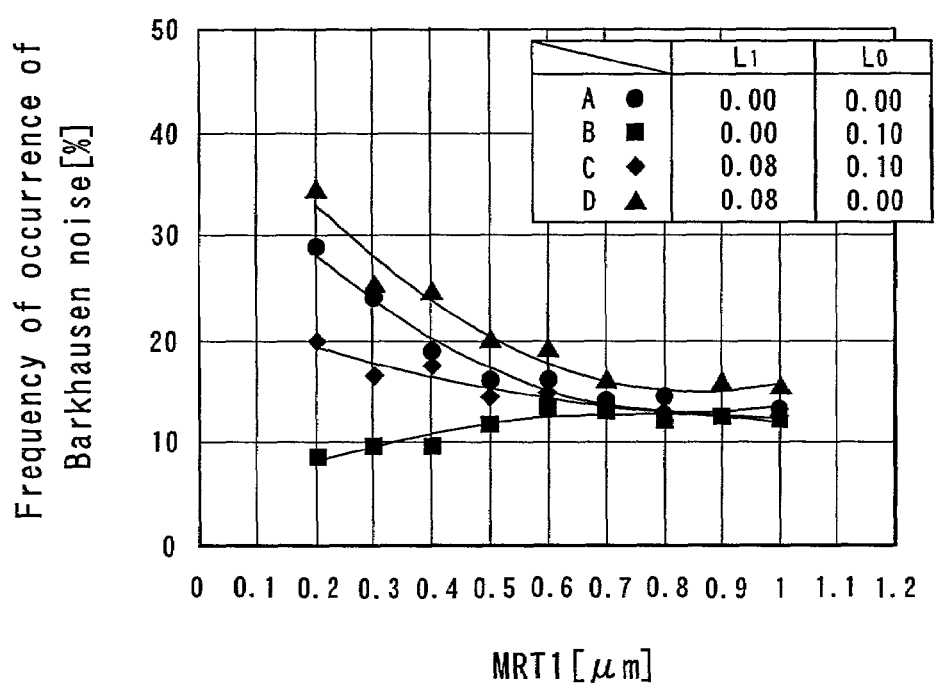
FIG. 16 is a plot that shows the result of experiment performed to obtain the relationship between the electrode space and the frequency of occurrence of Barkhausen noise of four types of magnetoresistive devices.

The table below and FIG. 16 show the result of experiment performed to obtain the relationship between the electrode space MRT1 and the frequency of occurrence of Barkhausen noise of those four types of devices. The figures in the table indicate the frequency of occurrence of Barkhausen noise in percent.

TABLE 2

| MRT1 [µm] | A | B | C | D |
| --- | --- | --- | --- | --- |
| 0.2 | 28.9 | 8.5 | 19.8 | 34.5 |
| 0.3 | 24.0 | 9.5 | 16.4 | 25.4 |
| 0.4 | 18.7 | 9.5 | 17.4 | 24.6 |
| 0.5 | 16.0 | 11.7 | 14.3 | 20.1 |
| 0.6 | 16.0 | 13.4 | 14.9 | 19.1 |
| 0.7 | 14.0 | 13.2 | 13.2 | 16.0 |
| 0.8 | 14.4 | 12.0 | 14.2 | 13.4 |
| 0.9 | 12.4 | 12.4 | 12.4 | 16.0 |
| 1.0 | 13.2 | 12.2 | 12.2 | 15.5 |

As shown in the table and FIG. 16, there is no great difference in the frequency of occurrence of Barkhausen noise among the four types in the range in which the electrode space MRT1 is greater than 0.6 µm. However, in the range in which the electrode space MRT1 is equal to or smaller than 0.6 µm, greater differences in the frequency of occurrence of Barkhausen noise are created among the four types, as the electrode space MRT1 decreases. In the range in which the electrode space MRT1 is equal to or smaller than 0.6 µm, the frequency of occurrence of type D is the highest, and the frequency of occurrence decreases in the order of type A, type C and type B. That is, in this range, the frequency of occurrence of Barkhausen noise of type B that is the device of the embodiment of the invention is lower than that of each of types A, C and D. In this range the frequency of occurrence of Barkhausen noise of type B decreases as the electrode space MRT1 decreases. In contrast, the frequency of occurrence of each of types A, C and D increases as the electrode space MRT1 decreases.

The reason that the frequency of occurrence of Barkhausen noise of each of types C and D increases as the electrode space MRT1 decreases is that the proportion of the widths of the domains 5C with respect to the entire width of the MR element 5 increases as the electrode space MRT1 decreases, and the effect of the domains 5C increases. The reason that the frequency of occurrence of Barkhausen noise of type A increases as the electrode space MRT1 decreases is that the proportion of the widths of the dead regions with respect to the entire width of the MR element 5 increases as the electrode space MRT1 decreases, and the effect of the dead regions increases.

The foregoing result of experiment shows that the magnetoresistive device of the embodiment of the invention more greatly reduces Barkhausen noise, compared to the devices having the other structures, such as types A, C and D. According to the experiment, the device of the embodiment exhibits a greater effect of reducing Barkhausen noise when the electrode space MRT1 is 0.6 µm or smaller.

The following are descriptions of the structure of the pinned layer 24 which is another feature of the magnetoresistive device and the thin-film magnetic head of this embodiment, and the operation and effects thereof.

Figure 17:
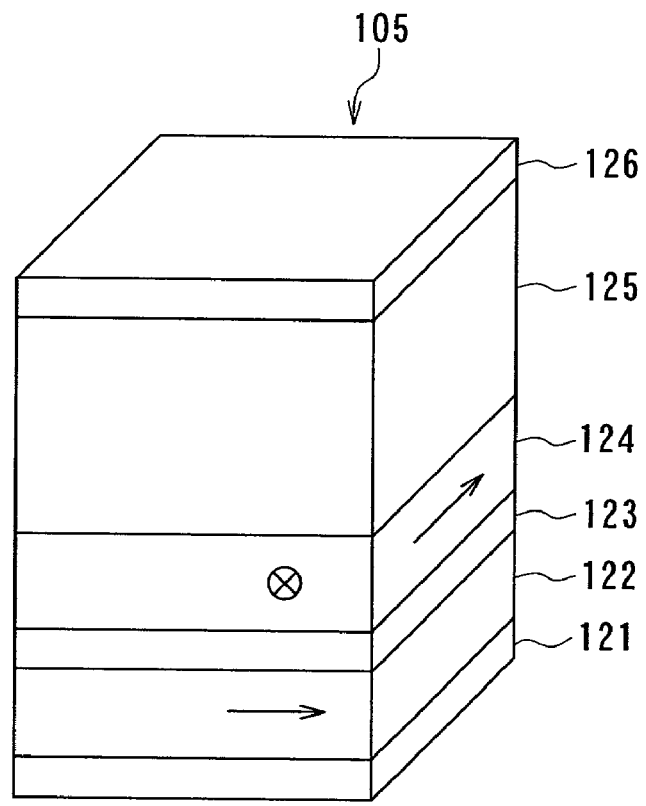
FIG. 17 is a perspective view that illustrates the configuration of layers of the MR element of a reference example.

A reference magnetoresistive device fabricated to be compared with the device of the embodiment of the invention will now be described. The reference magnetoresistive device incorporates a spin-valve GMR element as the MR element. This GMR element includes a normal pinned layer. FIG. 17 illustrates the configuration of layers of the MR element 105 of the reference device. The MR element 105 includes a base layer 121, a free layer 122, a spacer layer 123, a pinned layer 124, an antiferromagnetic layer 125, and a cap layer 126 that are stacked one by one on the bottom shield gap film. The pinned layer 124 does not include any nonmagnetic spacer layer but is made up of a ferromagnetic layer only, which is different from the pinned layer 24 of the embodiment of the invention. As the device of the embodiment, the electrode layers overlap the top surface of the MR element in the reference magnetoresistive device. The overlap amount thereof is equal to that of the embodiment of the invention.

The result of measurement for obtaining frequencies of occurrence of Barkhausen noise of this reference magnetoresistive device and the magnetoresistive device of the embodiment of the invention will now be described. While the frequency of occurrence of Barkhausen noise of the reference magnetoresistive device was 15%, that of the magnetoresistive device of the embodiment was 0%. It is therefore noted that the magnetoresistive device of the embodiment is capable of fully reducing Barkhausen noise.

Figure 18:
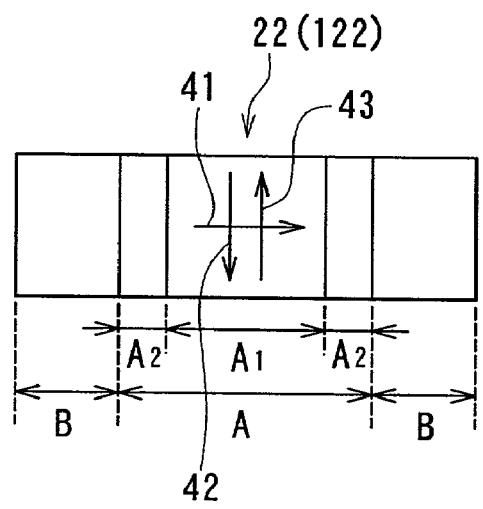
FIG. 18 is a top view of the free layer of each of the magnetoresistive device of the first embodiment of the invention and the reference magnetoresistive device.
Figure 19:
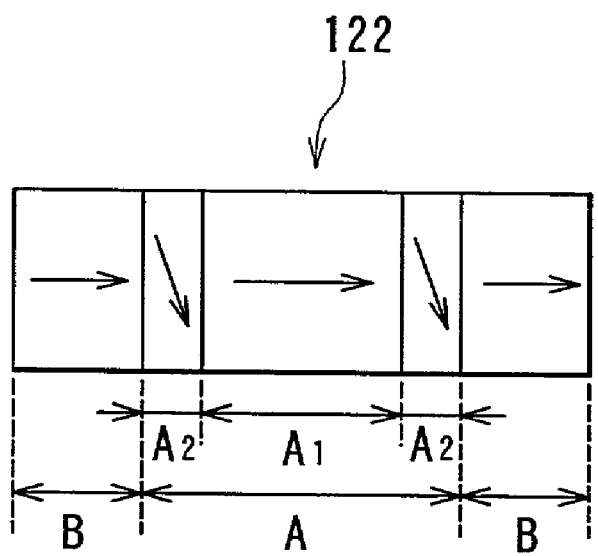
FIG. 19 is a top view that illustrates the state of magnetization of the free layer of the reference device.
Figure 20:
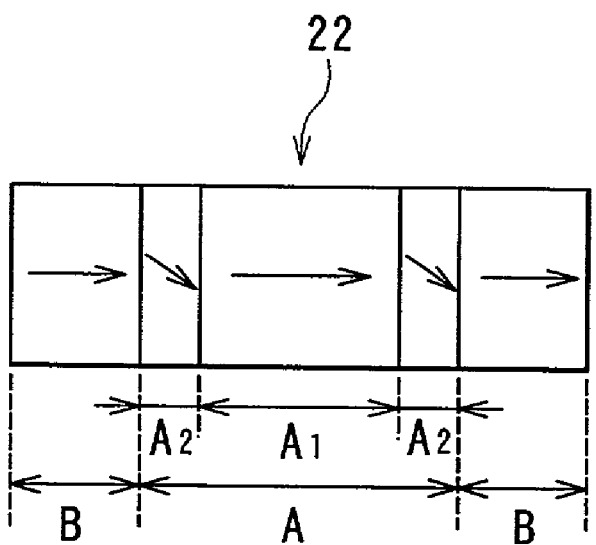
FIG. 20 is a top view that illustrates the state of magnetization of the free layer of the device of the first embodiment.

Reference is now made to FIG. 18 through FIG. 20 to describe the reason that the magnetoresistive device of the embodiment is capable of fully reducing Barkhausen noise.

FIG. 18 is a top view of the free layers 22 and 122 of the magnetoresistive device of the embodiment and the reference magnetoresistive device. Since the bias field applying layers 18 are located on both sides of the MR element 5 or 105, dead regions B are created near ends of the MR element 5 or 105 that are adjacent to the bias field applying layers 18, as shown in FIG. 18. In the dead regions B the magnetic field produced from the bias field applying layers 18 fixes the direction of magnetization, and sensing of a signal magnetic field is thereby prevented. The region of the free layer 22 or 122 except the dead regions B is an active region A. However, if the electrode layers overlap the top surface of the MR element, the electrode layers extend over the active region A. As a result, regions $A_2$ in which a sense current will not easily flow are created near ends of the active region A. A region $A_1$ in which a sense current easily flows is created between the two regions $A_2$ of the active region A.

In FIG. 18 the magnetic fields the free layer 22 or 122 receives and the directions thereof are indicated with arrows. The arrow indicated with numeral 41 represents the longitudinal bias field and its direction. The arrow indicated with numeral 42 represents the field supplied from the pinned layer 24 or 124 and its direction. The arrow indicated with numeral 43 represents the field generated by the sense current and its direction.

FIG. 19 is a top view that illustrates the state of magnetization of the free layer 122 of the reference device. FIG. 20 is a top view that illustrates the state of magnetization of the free layer 22 of the device of the embodiment of the invention. In FIG. 19 and FIG. 20 the arrows inside the free layers 122 and 22 indicate the directions of magnetization. As shown, of the active region A of each of the free layers 122 and 22, the direction of magnetization of the region $A_1$ in which a sense current easily flows corresponds to the direction of the longitudinal bias field 41. However, the direction of magnetization of the regions $A_2$ in which a sense current will not easily flow is the direction intermediate between the directions of the longitudinal bias field 41 and the field 42 supplied from the pinned layer 124 or 24. This is because, in the regions $A_2$ in which a sense current will not easily flow, the field 43 generated by the sense current is smaller, compared to the field 43 in the region $A_1$, and the effect of the field 42 supplied from the pinned layer 124 or 24 is therefore relatively greater. The directions of magnetization in the active region A of the free layer 122 or 22 is thus made uneven.

As shown in FIG. 19 and FIG. 20, the directions of magnetization of regions $A_2$ of the device of the embodiment are closer to the direction of the longitudinal bias field 41 than the directions of magnetization of regions $A_2$ of the reference device. The reason is that, since the two ferromagnetic layers 24a and 24c are antiferromagnetic-coupled in the pinned layer 24 of the device of the embodiment, the field generated by the pinned layer 24 is closed so as to pass through the ferromagnetic layers 24a and 24c. Therefore, the field generated by the pinned layer 24 has a smaller effect on the free layer 22 than the effect of the field generated by the normal pinned layer 124 of the reference device.

As thus described, according to the magnetoresistive device of the embodiment of the invention, the directions of magnetization of the active region A of the free layer 22 are more even than those of the active region A of the free layer 122 of the reference device. As a result, Barkhausen noise of the device of the embodiment is more greatly reduced, compared to the reference device.

According to the above-described definitions of the overlap amount of the electrode layers 6, both of the two electrode layers 6 overlap the top surface of the MR element 5, and the overlap amounts of the layers 6 are equal and each of them is smaller than 0.15 μm. However, even though the head is designed as such, the positions of the two electrode layers 6 may be misaligned when the layers 6 are actually fabricated. As a result, the overlap amounts of the two layers 6 may be different, as shown in FIG. 21, or only one of the layers 6 may overlap the top surface of the MR element 5 in an extreme case, as shown in FIG. 22.

Figure 21:
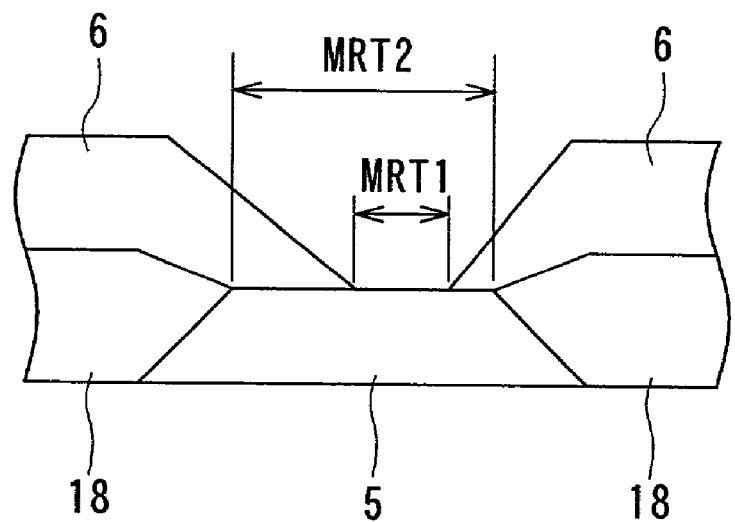
FIG. 21 illustrates a magnetoresistive device in which the overlap amounts of two electrode layers are different.
Figure 22:
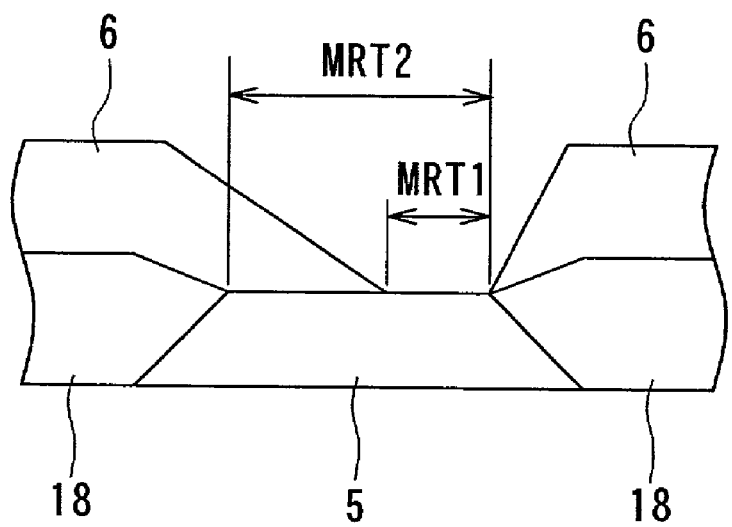
FIG. 22 illustrates a magnetoresistive device in which only one of the two electrode layers overlaps the top surface of the MR element.

A magnetoresistive devices of which the two electrode layers 6 have different overlap amounts, as shown in FIG. 21 and FIG. 22, were fabricated, and an experiment was performed to determine the effect on the head characteristics. In this experiment the devices of FIG. 8, FIG. 21 and FIG. 22 were each fabricated such that the total length of the regions of the two electrode layers 6 overlapping one of the surfaces of the MR element 5 is a constant value smaller than 0.3 μm. The characteristics of these devices were measured and compared. As a result, the devices of FIG. 21 and FIG. 22 have characteristics nearly similar to those of the devices of FIG. 8, with regard to the output of the device, the mean effective track width, the variation in effective track width (three times the standard deviation), and the frequency of occurrence of Barkhausen noise.

Therefore, according to the embodiment, it is acceptable that at least one of the two electrode layers 6 overlaps one of the surfaces of the MR element 5, and the total overlap amounts of the electrode layers 6 is smaller than 0.3 μm. To improve the head yield, the total overlap amounts is preferably 0.20 μm or smaller, and more preferably 0.10 μm or smaller. The total overlap amounts is preferably 0.006 μm or greater.

According to the magnetoresistive device and the thin-film magnetic head and the methods of manufacturing the same of the embodiment as thus described, the bias field applying layers 18 are located adjacent to the sides of the MR element 5, and at least one of the two electrode layers 6 overlaps the top surface of the MR element 5. As a result, Barkhausen noise is reduced while a reduction in output of the magnetoresistive device (the read head) is prevented. The sensitivity, output and output stability of the device are thereby improved.

According to the embodiment, the two bias field applying layers 18 do not overlap the top surface of the MR element 5. As a result, Barkhausen noise is more greatly reduced, and the output stability of the magnetoresistive device (the read head) is thereby more improved.

According to the embodiment, the total overlap amounts of the electrode layers 6 is smaller than 0.3 μm. It is thereby possible to determine the effective read track width with accuracy.

According to the embodiment, if the electrode space MRT1 is 0.6 μm or smaller, the effect of reducing Barkhausen noise and improving the output stability of the magnetoresistive device (the read head) is more enhanced.

According to the embodiment, the MR element 5 is a spin-valve GMR element in which the pinned layer 24 includes the nonmagnetic spacer layer 24b and the two ferromagnetic layers 24a and 24c that sandwich the spacer layer 24b and have directions of magnetization fixed to directions opposite to each other. As a result, Barkhausen noise is sufficiently reduced, and the output stability is further improved.

Second Embodiment

Figure 23:
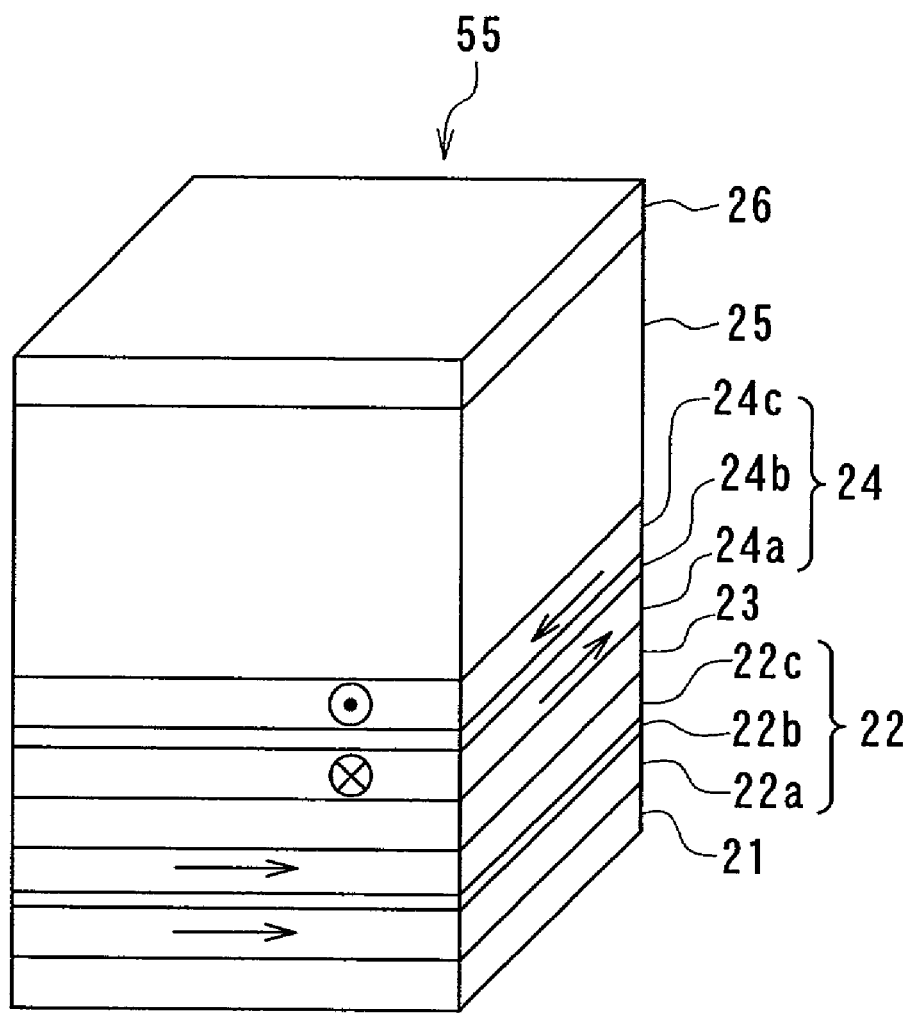
FIG. 23 is a perspective view that illustrates the configuration of layers of the MR element of a second embodiment of the invention.

Reference is now made to FIG. 23 to describe a magnetoresistive device, a thin-film magnetic head, and methods of manufacturing the same of a second embodiment of the invention. FIG. 23 is a perspective view that illustrates the configuration of layers of the MR element of this embodiment. The free layer 22 of the MR element 55 includes a first soft magnetic layer 22a, an intermediate layer 22b and a second soft magnetic layer 22c that are stacked on the base layer 21 one by one. The intermediate layer 22b is provided for increasing the rate of change in resistance of the MR element 55. The remainder of the configuration of the MR element 55 is similar to that of the MR element 5 of the first embodiment.

The intermediate layer 22b may have an electrical resistance greater than that of each of the first soft magnetic layer 22a and the second soft magnetic layer 22c, and may have magnetism. In this case, when a sense current flows through the MR element 55, the intermediate layer 22b reflects off at least part of the electrons and limits the path through which the electrons move, so that the rate of change in resistance of the MR element 55 is increased. This intermediate layer 22b preferably has a thickness of 0.5 to 1 nm. The intermediate layer 22b preferably includes at least one of an oxide, a nitride and a nitride oxide, which is magnetically stable and capable of reducing variation in output. The intermediate layer 22b preferably includes at least one of the elements that make up the first soft magnetic layer 22a. This is because part of the first soft magnetic layer 22a is oxidized, nitrided, or both oxidized and nitrided, so that the intermediate layer 22b of high quality is easily obtained. The intermediate layer 22b may include at least one element among the group consisting of Mn, Cr, Ni, Cu, Rh, Ir, and Pt.

The intermediate layer 22b may be a metal layer in which an element that makes up the first soft magnetic layer 22a and the second soft magnetic layer 22c is diffused. In this case, the intermediate layer 22b may be a Ta film having a thickness of 0.1 to 0.5 nm. The intermediate layer 22b may include at least one element among the group consisting of Al, Si, Ti, V, Cr, Mn, Ga, Ge, Y, Zr, Nb, Mo, Ru, Rh, Pd, In, Sn, Hf, Ta, W, Re, Os, Ir, and Pt. After the layers making up the MR element 55 are formed, annealing is performed, so that the element making up the soft magnetic layers 22a and 22b is diffused in the intermediate layer 22b, and the metal element making up the intermediate layer 22b is diffused in the soft magnetic layers 22a and 22b. This intermediate layer 22b increases the sheet resistance of the free layer 22 so that the rate of change in resistance of the MR element 55 is enhanced.

The intermediate layer 22b of the second embodiment may be provided in the middle of the first soft magnetic layer 22a or the second soft magnetic layer 22b.

According to the second embodiment, the rate of change in resistance of the MR element 55 is increased. The remainder of configuration, functions and effects of the second embodiment are similar to those of the first embodiment.

Third Embodiment

Figure 24:
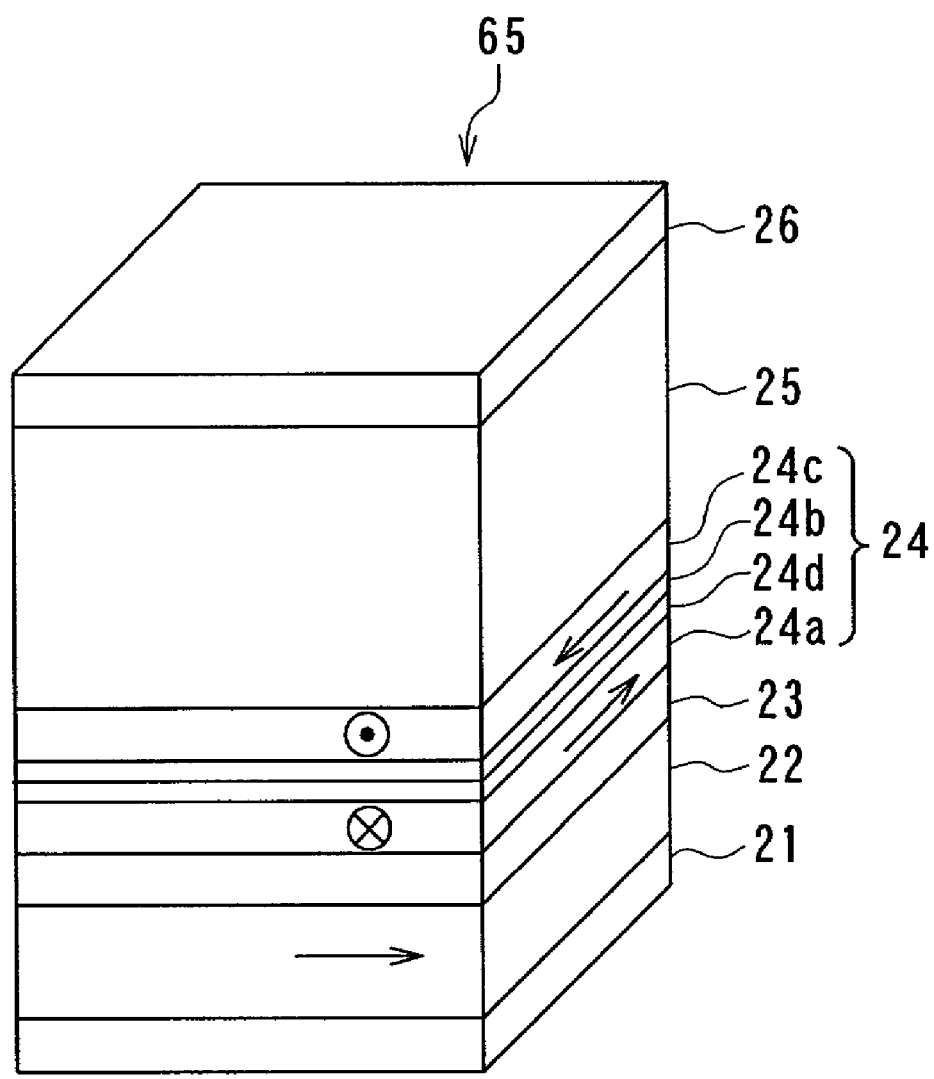
FIG. 24 is a perspective view that illustrates the configuration of layers of the MR element of a third embodiment of the invention.

Reference is now made to FIG. 24 to describe a magnetoresistive device, a thin-film magnetic head, and methods of manufacturing the same of a third embodiment of the invention. FIG. 24 is a perspective view that illustrates the configuration of layers of the MR element of this embodiment. The pinned layer 24 of the MR element 65 includes a reflection layer 24d. The reflection layer 24d of the example shown in FIG. 24 is located between the ferromagnetic layer 24a and the nonmagnetic spacer layer 24b.

The reflection layer 24d has an electrical resistance greater than that of each of the ferromagnetic layers 24a and 24c, and has magnetism. When a sense current flows through the MR element 65, the reflection layer 24d reflects off at least part of the electrons and limits the path through which the electrons move, so that the rate of change in resistance of the MR element 65 is increased.

The reflection layer 24d preferably has a thickness of 0.5 to 1 nm. The reflection layer 24d preferably includes at least one of an oxide, a nitride and a nitride oxide, which is magnetically stable and capable of reducing variation in output. The reflection layer 24d preferably includes at least one of the elements that make up the ferromagnetic layer 24a. This is because part of the ferromagnetic layer 24a is oxidized, nitrided, or both oxidized and nitrided, so that the reflection layer 24d of high quality is easily obtained. The reflection layer 24d may include a dopant that is at least one element among the group consisting of Mn, Cr, Ni, Cu, Rh, Ir, and Pt, so as to improve thermal stability. To be specific, the reflection layer 24d preferably includes: at least one element among the group consisting of Ni, Co, and Fe; at least one element among the group consisting of O and N; and at least one element among the group consisting of Mn, Cr, Ni, Cu, Rh, Ir, and Pt.

The reflection layer 24d may be provided in the middle of the ferromagnetic layer 24a or 24c.

According to the third embodiment, the rate of change in resistance of the MR element 65 is increased. The remainder of configuration, functions and effects of the third embodiment are similar to those of the first embodiment.

The present invention is not limited to the foregoing embodiments but may be practiced in still other ways. For example, the MR element may be made up of the layers stacked in the order reverse of that of each of the foregoing embodiments.

In the foregoing embodiments, the thin-film magnetic head is disclosed, comprising the MR device for reading formed on the base body and the induction-type electromagnetic transducer for writing stacked on the MR device. Alternatively, the MR device may be stacked on the electromagnetic transducer.

If the thin-film magnetic head is dedicated to reading, the head may comprise the MR device for reading only.

The MR device of the invention is not limited to the read head of the thin-film magnetic head but may be applied to a rotational position sensor, a magnetic sensor, a current sensor, and so on.

According to the magnetoresistive device and the method of manufacturing the same, or the thin-film magnetic head and the method of manufacturing the same of the invention described so far, the bias field applying layers are located adjacent to the side portions of the magnetoresistive element, and at least one of the two electrode layers overlaps one of the surfaces of the magnetoresistive element. As a result, the sensitivity, output and output stability of the magnetoresistive device or the thin-film magnetic head are improved. Furthermore, according to the invention, the magnetoresistive element incorporates: the nonmagnetic layer having two surfaces that face toward opposite directions; the soft magnetic layer adjacent to one of the surfaces of the nonmagnetic layer; the pinned layer, located adjacent to the other one of the surfaces of the nonmagnetic layer, whose direction of magnetization is fixed; and the antiferromagnetic layer located adjacent to one of the surfaces of the pinned layer that is farther from the nonmagnetic layer, the antiferromagnetic layer fixing the direction of magnetization of the pinned layer. The pinned layer includes the nonmagnetic spacer layer and the two ferromagnetic layers that sandwich the spacer layer. The directions of magnetization of the two ferromagnetic layers are fixed to the opposite directions. As a result, the output stability is further improved.

According to the magnetoresistive device and the method of manufacturing the same, or the thin-film magnetic head and the method of manufacturing the same of the invention, the total length of the regions of the two electrode layers that overlap one of the surfaces of the magnetoresistive element may be smaller than 0.3 µm. It is thereby possible to define the effective read track width with accuracy.

According to the magnetoresistive device and the method of manufacturing the same, or the thin-film magnetic head and the method of manufacturing the same of the invention, the two bias field applying layers may be located off the one of the surfaces of the magnetoresistive element. In this case, the output stability of the magnetoresistive device or the thin-film magnetic head is further improved.

According to the magnetoresistive device and the method of manufacturing the same, or the thin-film magnetic head and the method of manufacturing the same of the invention, the space between the two electrode layers may be approximately 0.6 µm or smaller. In this case, the effect of improving the output stability of the magnetoresistive device or the thin-film magnetic head is more enhanced.

Obviously many modifications and variations of the present invention are possible in the light of the above teachings. It is therefore to be understood that within the scope of the appended claims the invention may be practiced otherwise than as specifically described.

What is claimed is:

1. A magnetoresistive device comprising:
   a magnetoresistive element having two surfaces that face toward opposite directions and two side portions that connect the two surfaces to each other;
   two bias field applying layers that are located adjacent to the side portions of the magnetoresistive element and apply a bias magnetic field to the magnetoresistive element; and
   two electrode layers that feed a current used for signal detection to the magnetoresistive element, each of the electrode layers being adjacent to one of surfaces of each of the bias field applying layers, wherein:
   at least one of the electrode layers overlaps one of the surfaces of the magnetoresistive element;
   the magnetoresistive element incorporates: a nonmagnetic layer having two surfaces that face toward opposite directions; a soft magnetic layer adjacent to one of the surfaces of the nonmagnetic layer; a pinned layer, located adjacent to the other one of the surfaces of the nonmagnetic layer, whose direction of magnetization is fixed; and an antiferromagnetic layer located adjacent to one of surfaces of the pinned layer that is farther from the nonmagnetic layer, the antiferromagnetic layer fixing the direction of magnetization of the pinned layer;
   the pinned layer includes a nonmagnetic spacer layer and two ferromagnetic layers that sandwich the spacer layer and have directions of magnetization fixed to opposite directions;
   a total length of regions of the two electrode layers that are laid over the one of the surfaces of the magnetoresistive element is smaller than 0.3 µm; and
   a space between the two electrode layers is equal to or smaller than approximately 0.4 µm.

2. The magnetoresistive device according to claim 1, wherein both of the two electrode layers overlap the one of the surfaces of the magnetoresistive element, and a length of the region of each of the two electrode layers that is laid over the one of the surfaces of the magnetoresistive element is smaller than 0.15 µm.

3. The magnetoresistive device according to claim 1, wherein the two bias field applying layers are located off one of the surfaces of the magnetoresistive element.

4. A method of manufacturing a magnetoresistive device comprising:
   a magnetoresistive element having two surfaces that face toward opposite directions and two side portions that connect the two surfaces to each other;
   two bias field applying layers that are located adjacent to the side portions of the magnetoresistive element and apply a bias magnetic field to the magnetoresistive element; and
   two electrode layers that feed a current used for signal detection to the magnetoresistive element, each of the electrode layers being adjacent to one of surfaces of each of the bias field applying layers, the method including the steps of:
   forming the magnetoresistive element;
   forming the bias field applying layers; and
   forming the electrode layers, wherein:
   at least one of the electrode layers are located to overlap one of the surfaces of the magnetoresistive element;
   the magnetoresistive element incorporates: a nonmagnetic layer having two surfaces that face toward opposite directions; a soft magnetic layer adjacent to one of the surfaces of the nonmagnetic layer; a pinned layer, located adjacent to the other one of the surfaces of the nonmagnetic layer, whose direction of magnetization is fixed; and an antiferromagnetic layer located adjacent to one of surfaces of the pinned layer that is farther from the nonmagnetic layer, the antiferromagnetic layer fixing the direction of magnetization of the pinned layer;
   the pinned layer includes a nonmagnetic spacer layer and two ferromagnetic layers that sandwich the spacer layer and have directions of magnetization fixed to opposite directions;
   a total length of regions of the two electrode layers that are laid over the one of the surfaces of the magnetoresistive element is smaller than 0.3 µm; and
   a space between the two electrode layers is equal to or smaller than approximately 0.4 µm.

5. The method according to claim 4, wherein both of the two electrode layers overlap the one of the surfaces of the magnetoresistive element, and a length of the region of each of the two electrode layers that is laid over the one of the surfaces of the magnetoresistive element is smaller than 0.15 µm.

6. The method according to claim 4, wherein the two bias field applying layers are located off one of the surfaces of the magnetoresistive element.

7. A thin-film magnetic head comprising:
a magnetoresistive element having two surfaces that face toward opposite directions and two side portions that connect the two surfaces to each other;
two bias field applying layers that are located adjacent to the side portions of the magnetoresistive element and apply a bias magnetic field to the magnetoresistive element; and
two electrode layers that feed a current used for signal detection to the magnetoresistive element, each of the electrode layers being adjacent to one of surfaces of each of the bias field applying layers, wherein:
at least one of the electrode layers overlaps one of the surfaces of the magnetoresistive element;
the magnetoresistive element incorporates: a nonmagnetic layer having two surfaces that face toward opposite directions; a soft magnetic layer adjacent to one of the surfaces of the nonmagnetic layer; a pinned layer, located adjacent to the other one of the surfaces of the nonmagnetic layer, whose direction of magnetization is fixed; and an antiferromagnetic layer located adjacent to one of surfaces of the pinned layer that is farther from the nonmagnetic layer, the antiferromagnetic layer fixing the direction of magnetization of the pinned layer;
the pinned layer includes a nonmagnetic spacer layer and two ferromagnetic layers that sandwich the spacer layer and have directions of magnetization fixed to opposite directions;
a total length of regions of the two electrode layers that are laid over the one of the surfaces of the magnetoresistive element is smaller than 0.3 µm; and
a space between the two electrode layers is equal to or smaller than approximately 0.4 µm.

8. The thin-film magnetic head according to claim 7, wherein both of the two electrode layers overlap the one of the surfaces of the magnetoresistive element, and a length of the region of each of the two electrode layers that is laid over the one of the surfaces of the magnetoresistive element is smaller than 0.15 µm.

9. The thin-film magnetic head according to claim 7, wherein the two bias field applying layers are located off one of the surfaces of the magnetoresistive element.

10. A method of manufacturing a thin-film magnetic head comprising:
a magnetoresistive element having two surfaces that face toward opposite directions and two side portions that connect the two surfaces to each other;
two bias field applying layers that are located adjacent to the side portions of the magnetoresistive element and apply a bias magnetic field to the magnetoresistive element; and
two electrode layers that feed a current used for signal detection to the magnetoresistive element, each of the electrode layers being adjacent to one of surfaces of each of the bias field applying layers, the method including the steps of:
forming the magnetoresistive element;
forming the bias field applying layers; and
forming the electrode layers, wherein:
at least one of the electrode layers are located to overlap one of the surfaces of the magnetoresistive element;
the magnetoresistive element incorporates: a nonmagnetic layer having two surfaces that face toward opposite directions; a soft magnetic layer adjacent to one of the surfaces of the nonmagnetic layer; a pinned layer, located adjacent to the other one of the surfaces of the nonmagnetic layer, whose direction of magnetization is fixed; and an antiferromagnetic layer located adjacent to one of surfaces of the pinned layer that is farther from the nonmagnetic layer, the antiferromagnetic layer fixing the direction of magnetization of the pinned layer;
the pinned layer includes a nonmagnetic spacer layer and two ferromagnetic layers that sandwich the spacer layer and have directions of magnetization fixed to opposite directions;
a total length of regions of the two electrode layers that are laid over the one of the surfaces of the magnetoresistive element is smaller than 0.3 µm; and
a space between the two electrode layers is equal to or smaller than approximately 0.4 µm.

11. The method according to claim 10, wherein both of the two electrode layers overlap the one of the surfaces of the magnetoresistive element, and a length of the region of each of the two electrode layers that is laid over the one of the surfaces of the magnetoresistive element is smaller than 0.15 µm.

12. The method according to claim 10, wherein the two bias field applying layers are located off one of the surfaces of the magnetoresistive element.

* * * * *